(12) United States Patent
Morita et al.

(10) Patent No.: US 9,754,904 B2
(45) Date of Patent: Sep. 5, 2017

(54) ELECTRONIC APPARATUS AND METHOD FOR MANUFACTURING ELECTRONIC APPARATUS

(71) Applicant: FUJITSU LIMITED, Kawasaki-shi, Kanagawa (JP)

(72) Inventors: Masaru Morita, Isehara (JP); Nobuhiro Imaizumi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/212,656

(22) Filed: Jul. 18, 2016

(65) Prior Publication Data

US 2017/0047302 A1  Feb. 16, 2017

(30) Foreign Application Priority Data

Aug. 13, 2015 (JP) ................. 2015-159901

(51) Int. Cl.
*H01L 23/00* (2006.01)
*H01L 25/00* (2006.01)
(Continued)

(52) U.S. Cl.
CPC .......... *H01L 24/05* (2013.01); *H01L 23/5389* (2013.01); *H01L 24/03* (2013.01); *H01L 24/13* (2013.01); *H01L 23/3121* (2013.01); *H01L 2224/03464* (2013.01); *H01L 2224/0401* (2013.01); *H01L 2224/04105* (2013.01);
(Continued)

(58) Field of Classification Search
CPC ..... H01L 2224/32225; H01L 21/31695; H01L 2224/3201; H01L 23/49513; H01L 2224/48091; H01L 2224/32145; H01L 2924/0665; H01L 2924/014; H01L 23/49827; H01L 2924/15311; H01L 2224/05599; H01L 24/13; H01L 24/03; H01L 2224/73265; H01L 2224/73204; H01L 2224/24137; H01L 2224/16227; H01L 2224/05025; H01L 2224/0401; H01L 2224/13026; H01L 2224/24195; H01L 23/3121; H01L 2924/0002; H01L 21/561; H01L 2224/0901
See application file for complete search history.

(56) References Cited

U.S. PATENT DOCUMENTS 7,115,969 B1* 10/2006 Patel .................. B81C 1/00182
257/532
2002/0121709 A1* 9/2002 Matsuki ............ H01L 23/49811
257/786
(Continued)

FOREIGN PATENT DOCUMENTS

JP  2010-109380 A1  5/2010
JP  2011-165871 A1  8/2011
JP  2012-216772 A1  11/2012

*Primary Examiner* — Jasmine Clark
(74) *Attorney, Agent, or Firm* — Kratz, Quintos & Hanson, LLP

(57) ABSTRACT

An electronic apparatus includes: a first substrate; an electrode over the first substrate; a first conductor having a porous structure above the first substrate, the first conductor covering an upper surface and a side surface of the electrode; and an insulator above the first substrate, the insulator covering an upper surface and a side surface of the first conductor, wherein the insulator has an opening that exposes the first conductor.

15 Claims, 28 Drawing Sheets

(51) Int. Cl.
*H01L 25/065* (2006.01)
*H01L 23/538* (2006.01)
*H01L 23/31* (2006.01)

(52) U.S. Cl.
CPC ............... *H01L 2224/05018* (2013.01); *H01L 2224/05025* (2013.01); *H01L 2224/05078* (2013.01); *H01L 2224/05255* (2013.01); *H01L 2224/10126* (2013.01); *H01L 2224/13026* (2013.01); *H01L 2224/16227* (2013.01); *H01L 2224/24137* (2013.01); *H01L 2224/24195* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/06513* (2013.01); *H01L 2924/1531* (2013.01)

(56) References Cited

U.S. PATENT DOCUMENTS

| | | |
|---|---|---|
| 2011/0192630 A1 | 8/2011 | Ishino |
| 2012/0248618 A1 | 10/2012 | Akino |
| 2014/0193971 A1* | 7/2014 | Akino ................... H01L 24/05 |
| | | 438/612 |

* cited by examiner

ELECTRONIC APPARATUS AND METHOD FOR MANUFACTURING ELECTRONIC APPARATUS

CROSS-REFERENCE TO RELATED APPLICATION

This application is based upon and claims the benefit of priority of the prior Japanese Patent Application No. 2015-159901, filed on Aug. 13, 2015, the entire contents of which are incorporated herein by reference.

FIELD

The embodiments discussed herein are related to an electronic apparatus and a method for manufacturing an electronic apparatus.

BACKGROUND

A technique relating to semiconductor devices and providing on a conductor an insulator (a protective film) having an opening section that extends to a portion of the conductor, and a technique that connects a wire, a bump, or the like, to a portion of the conductor that is exposed from the opening section of the insulator, are known.

A technique has been suggested in which such conductor uses a porous metal film provided with pores that absorbs stress generated by the impact of wire bonding. In addition, a technique in which a multilayer structure including a pad electrode and a barrier film of a bump electrode material is used for a conductor, and a technique that provides a conductive particulate film made of nickel (Ni) or the like on a barrier film that is exposed from an opening section of the insulator are suggested.

In a structure in which an insulator having an opening section that extends to a portion of a conductor is provided on the conductor, if the adhesion between the conductor and the insulator is low, there is a possibility that the insulator is separated from the conductor. If such separation of the insulator from the conductor occurs, there may be a decrease in the protective effect of the insulator, and failures or the like in the electrical connections that use the conductor below the insulator may be caused.

Separation of the insulator from the conductor may occur not only in semiconductor devices, but in various electronic apparatuses such as semiconductor elements and circuit boards that use similar structures of a conductor and an insulator.

The followings are reference documents.
[Document 1] Japanese Laid-open Patent Publication No. 2012-216772 and
[Document 2] Japanese Laid-open Patent Publication No. 2010-109380.

SUMMARY

According to an aspect of the invention, an electronic apparatus includes: a first substrate; an electrode over the first substrate; a first conductor having a porous structure above the first substrate, the first conductor covering an upper surface and a side surface of the electrode; and an insulator above the first substrate, the insulator covering an upper surface and a side surface of the first conductor, wherein the insulator has an opening that exposes the first conductor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Initially, configuration examples (first to third examples) of electronic apparatuses such as a semiconductor device, a circuit board, or the like, are described.

FIGS. 1A to 2C are explanatory drawings of an electronic apparatus according to a first example. FIGS. 1A to 2C schematically illustrate cross-sections of main portions each corresponding to a process of a method of forming the electronic apparatus according to the first example. The method illustrated in FIGS. 1A to 2C is an example of a method of forming the electronic apparatus using an electrolytic plating method.

Figure 1A:
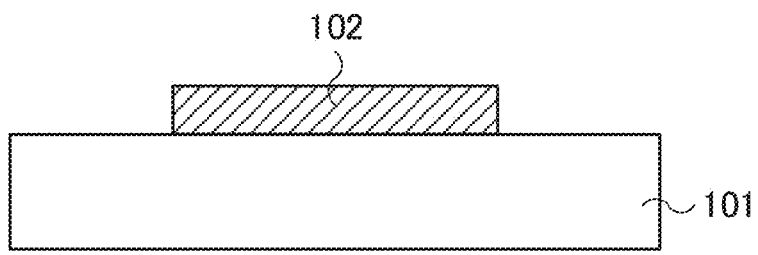
FIGS. 1A to 1D are explanatory drawings of an electronic apparatus according to a first example (1 of 2)
Figure 1B:
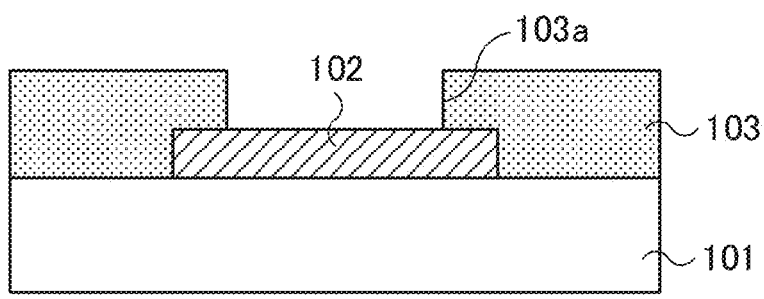
Figure 1C:
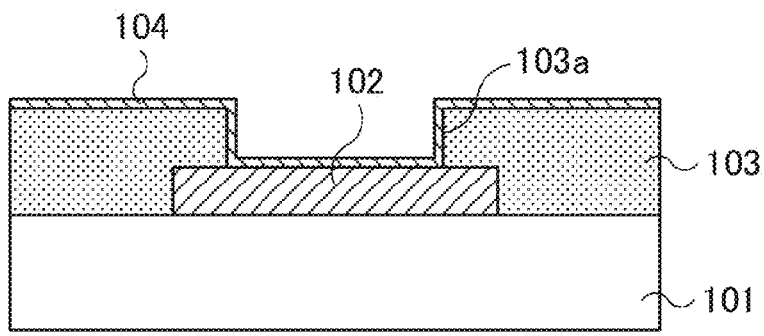
Figure 1D:
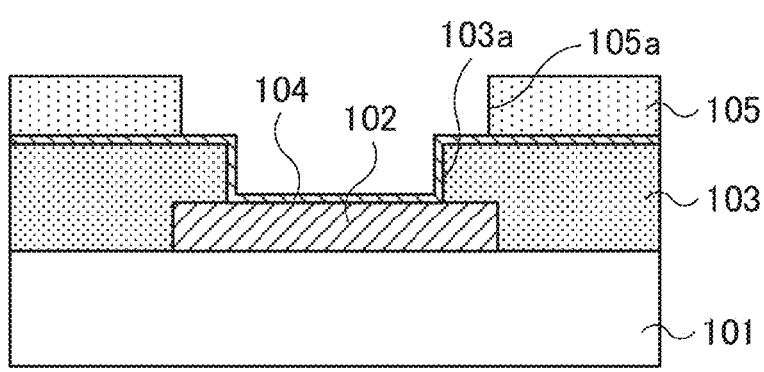

In the method, first, as illustrated in FIG. 1A, an electrode layer 102 such as a land or a pad is formed on a substrate 101, which is a main body of the electronic apparatus, using electrolytic plating of copper (Cu) or the like. Next, an insulation layer 103, which has an opening section 103a that extends to a portion of the electrode layer 102 as illustrated in FIG. 1B is formed by forming an insulating material to cover the electrode layer 102, and removing a portion of the insulating material. Next, as illustrated in FIG. 1C, titanium (Ti), Cu or the like is formed over the entire surface as a seed layer 104 using a sputtering method. Next, as illustrated in FIG. 1D, a photoresist 105 having an opening section 105a in a region that includes the opening section 103a of the insulation layer 103, is formed on the seed layer 104.

Figure 2A:
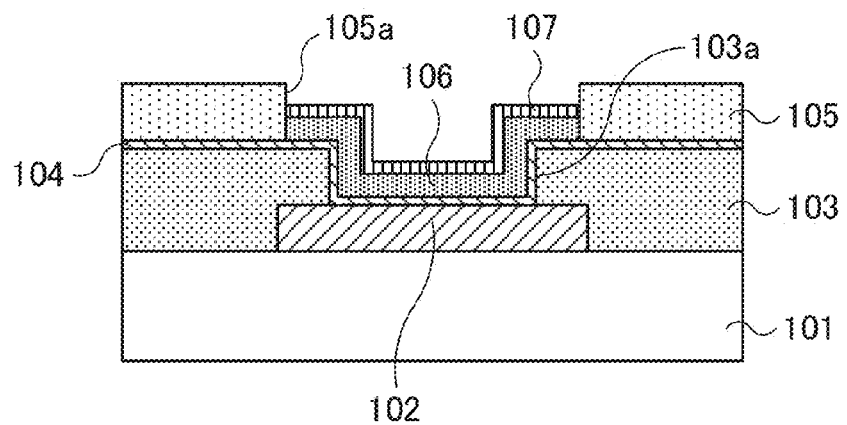
FIGS. 2A to 2C are explanatory drawings of the electronic apparatus according to the first example (2 of 2)
Figure 2B:
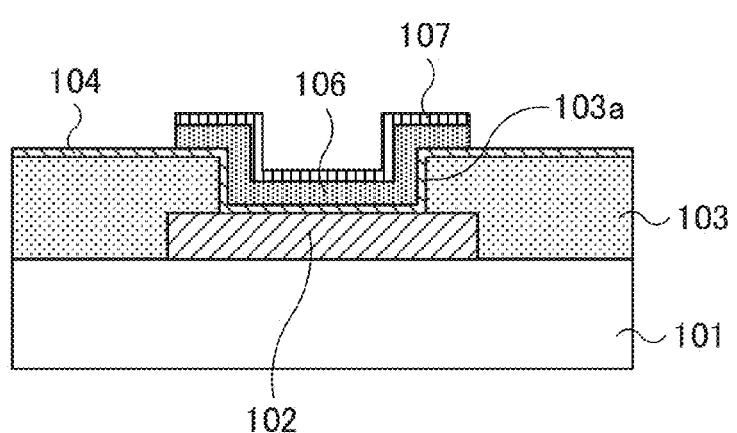
Figure 2C:
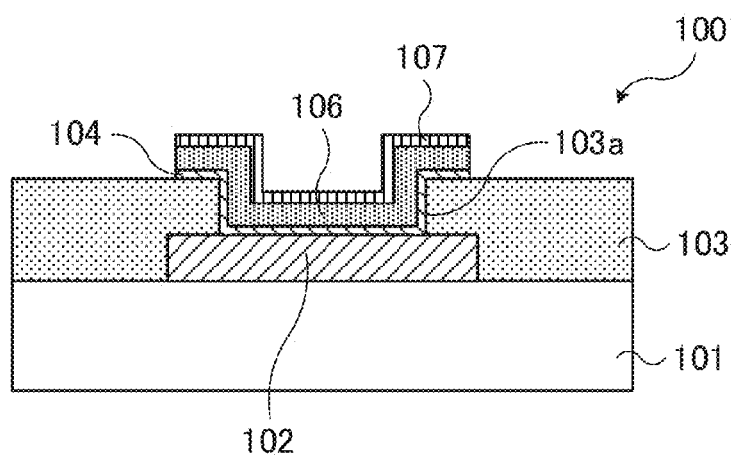

After the formation of the photoresist 105, as illustrated in FIG. 2A, a barrier layer 106 made of Ni or the like, is formed on the seed layer 104, which is inside the opening section 105a of the photoresist 105, and a surface treatment layer 107 made of gold (Au) or the like, is formed on the barrier layer 106 using electrolytic plating. After that, as illustrated in FIG. 2B, the photoresist 105 is removed, and as illustrated in FIG. 2C, the seed layer 104 exposed after the removal of the photoresist 105 is removed by etching.

For example, solder is bonded to the tops of the barrier layer 106 and the surface treatment layer 107 of an electronic apparatus 100 that is formed in this manner. The surface treatment layer 107 has a function of controlling oxidation of the barrier layer 106 before solder bonding, and forms an alloy with the solder comparatively easily during solder bonding. The barrier layer 106 electrically connects the electrode layer 102, which is provided below, and solder, which is provided above, and has a function of suppressing the diffusion and alloying of components of the electrode layer 102 and the solder. Degradation of the electrode layer 102, further degradation of a ground conductor section of the electrode layer 102, degradation of the bonding strength between the solder and the electrode layer 102, and the like, is suppressed by suppressing diffusion and alloying of components of the electrode layer 102 and the solder.

The formation of such an electronic apparatus 100 that uses an electrolytic plating method, includes at least seven steps such as those illustrated in FIGS. 1A to 2C above, and has a comparatively large number of man-hours.

Figure 3A:
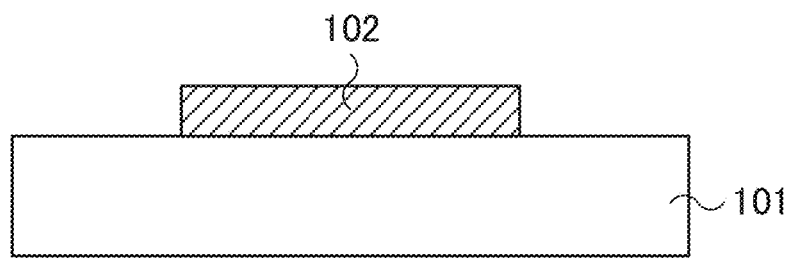
FIGS. 3A to 3C are explanatory drawings of an electronic apparatus according to a second example.
Figure 3B:
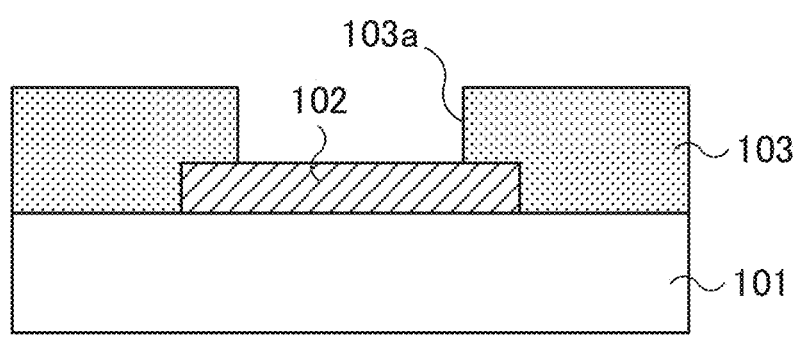
Figure 3C:
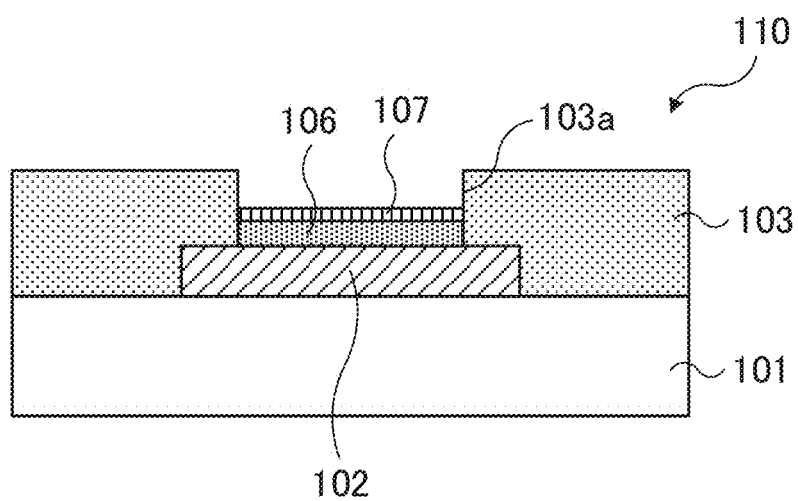

FIGS. 3A to 3C are explanatory drawings of an electronic apparatus according to a second example. In FIGS. 3A to 3C, cross-sections of main portions each corresponding to a process of a method of forming the electronic apparatus according to the second example are illustrated schematically. The method illustrated in FIGS. 3A to 3C is an example of a method of forming the electronic apparatus using an electrolytic plating method and a non-electrolytic plating method.

In the method, in the same manner as FIG. 1A above, as illustrated in FIG. 3A, the electrode layer 102 is formed on the substrate 101 using electrolytic plating of Cu or the like. Next, in the same manner as FIG. 1B above, an insulation layer 103, which has an opening section 103a that extends to a portion of the electrode layer 102 in the manner illustrated in FIG. 3B is formed, by forming an insulating material to cover the electrode layer 102, and removing a portion of the insulating material. Thereafter, as illustrated in FIG. 3C, a barrier layer 106 made of Ni or the like, is formed on the electrode layer 102, which is exposed from the opening section 103a of the insulation layer 103, and a surface treatment layer 107 made of Au or the like, is formed on the barrier layer 106 using non-electrolytic plating. Additionally, phosphorous (P) and boron (B) may be incorporated in such a barrier layer 106 formed by non-electrolytic plating.

In the formation of such an electronic apparatus 110 that uses a non-electrolytic plating method, it is possible to reduce the man-hours in comparison with the formation of the above-mentioned electronic apparatus 100 (FIGS. 1A to 2C).

In addition, in the electronic apparatus 110 formed using such a method as described in FIGS. 3A to 3C, it is possible to make the area of the electrode layer 102 greater than the area of the barrier layer 106. Therefore, it is possible to connect a via hole with a comparatively large diameter, to connect multiple via holes with comparatively small diameter, to connect (stack) a conductor pattern with a comparatively large area, or the like, to the bottom of the electrode layer 102, and therefore, it is possible to realize an electronic apparatus 110 through which a large current is caused to flow.

However, in the electronic apparatus 110, when the size of the opening of the opening section 103a of the insulation layer 103 is made to be small, formation of the barrier layer 106 using non-electrolytic plating is difficult. The reason for this is that when the opening section 103a is small, the surface area of the ground electrode layer 102, which is exposed inside the opening section 103a, is small, a contact area of the electrode layer 102 and the plating solution is small, and it is difficult to generate a core for growing the barrier layer 106. For example, there is a tendency for the above-mentioned difficulty to occur easily when the opening section 103a has an opening the size of which is 20 µm or less in diameter.

In contrast to this, in the above-mentioned electronic apparatus 100 in which the barrier layer 106 is formed using electrolytic plating, plating components are forcibly precipitated as a result of electrification. Therefore, if there is fixed wettability between the plating solution and the insulation layer 103, even if the opening section 103a has an opening the size of which is 20 µm or less in diameter, it is possible to form the barrier layer 106. However, even in a case of electrolytic plating, formation of the barrier layer 106 is also difficult when the opening section 103a has a smaller opening size with a diameter of 10 µm or less.

Figure 4:
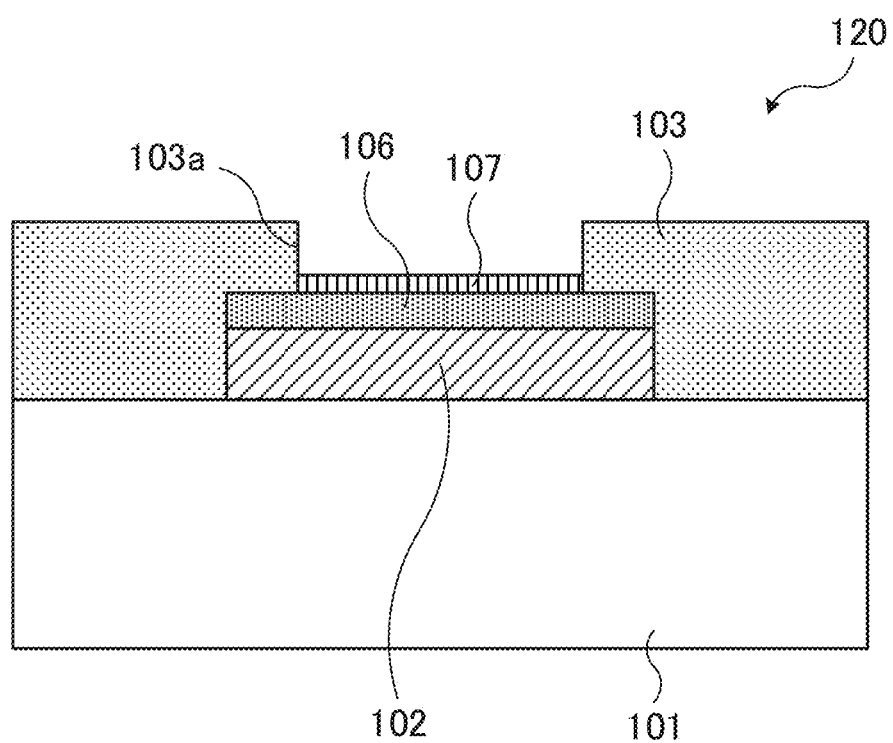
FIG. 4 is an explanatory drawing of an electronic apparatus according to a third example (1 of 2)
Figure 5:
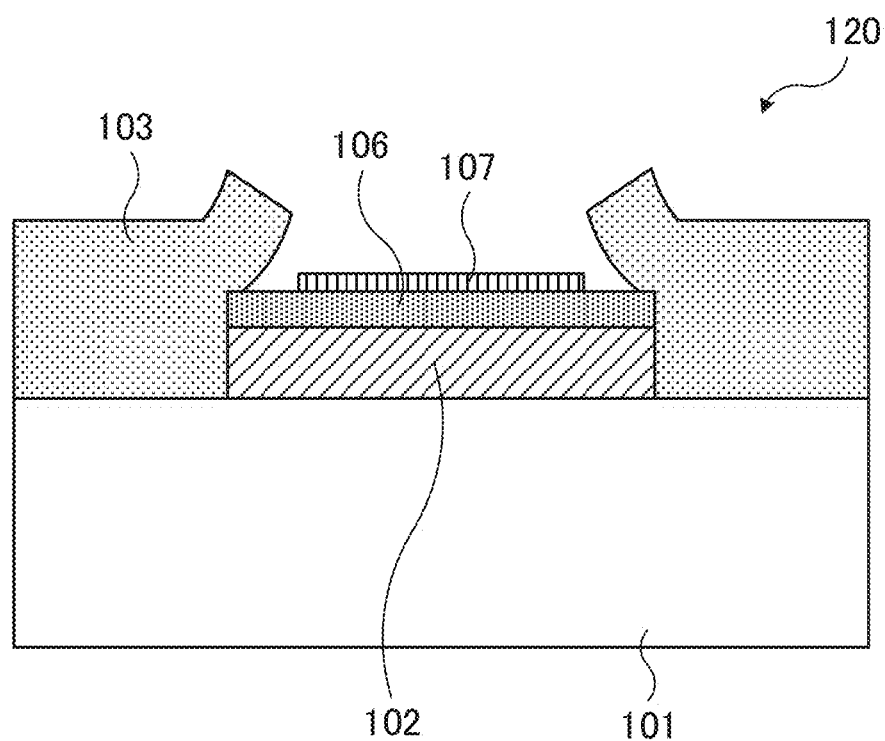
FIG. 5 is an explanatory drawing of the electronic apparatus according to the third example (2 of 2)

FIGS. 4 and 5 are explanatory drawings of an electronic apparatus according to a third example.

An electronic apparatus 120 illustrated in FIG. 4 differs from the above-mentioned electronic apparatus 110 (FIG. 3C) in that the barrier layer 106 is provided to cover the upper surface of the electrode layer 102, and the insulation layer 103, which has the opening section 103a that extends to a portion of the barrier layer 106, is formed thereabove.

For example, in a case of forming an electronic apparatus 120 as illustrated in FIG. 4, formation of the barrier layer 106 using non-electrolytic plating is performed after the formation of an electrode layer 102 as illustrated in FIG. 3A above. Thereafter, the insulation layer 103, which has the opening section 103a that extends to a portion of the barrier layer 106 is formed by forming an insulating material to cover the electrode layer 102 and the barrier layer 106, and removing a portion of the insulating material in accordance with the example of FIG. 3B above. Further, the surface treatment layer 107 is formed on the barrier layer 106 of a portion exposed from the opening section 103a, in accordance with the example of FIG. 3C above. As a result of such a method, it is possible to form an electronic apparatus 120 as illustrated in FIG. 4.

In an electronic apparatus 120 as illustrated in FIG. 4, since the barrier layer 106 is formed before the formation of the insulation layer 103, which includes the opening section 103a, it is possible to provide the barrier layer 106 inside the opening section 103a regardless of the opening size of the opening section 103a.

However, in the electronic apparatus 120, if the adhesion between the barrier layer 106 and the insulation layer 103 is low, for example, as illustrated in FIG. 5, a circumstance in which the insulation layer 103 becomes separated from the barrier layer 106 may occur as a result of a heating treatment such as reflow during solder bonding. As one example, in a case in which Ni is used in the barrier layer 106, and a resin is used in the insulation layer 103, since the adhesion between Ni and resins is comparatively low, there is a tendency for the separation of the insulation layer 103 from the barrier layer 106 as illustrated in FIG. 5, to occur easily.

When such separation of the insulation layer 103 occurs, the function of the insulation layer 103 as a protective film deteriorates, and therefore, there is a concern that the mechanical strength of the electronic apparatus 120 may deteriorate such as the circuit that includes the barrier layer 106, the electrode layer 102 and the like, becoming disconnected, failing, or the like as a result of an impact.

In addition, in a case in which solder is bonded onto the barrier layer 106, there is a concern that the solder, which melts due to heating during bonding, may leak in between the barrier layer 106 and the insulation layer 103 that is separated therefrom. When the solder leaks in between the barrier layer 106 and the insulation layer 103, there is a concern that the electrode layer 102 and the solder maybe in contact with one another and that alloying thereof may occur, that there are variations in the height of the solder bump to be formed, that short circuit may occur due to the leaked-in solder, and the like.

Furthermore, it is easy for water content or the like to infiltrate between the barrier layer 106 and the insulation layer 103 that is separated therefrom, and therefore, there is a concern that the longevity of the barrier layer 106, the electrode layer 102, and the like are reduced, and that it is easy for electromigration to occur.

Separation of the insulation layer 103 as illustrated in FIG. 5 is not limited to an electronic apparatus 120 as illustrated in FIG. 4 in which the insulation layer 103 is in contact with the upper surface of the barrier layer 106, and may also occur in the same manner as in an electronic apparatus 110 as illustrated in FIGS. 3A to 3C in which the insulation layer 103 is in contact with the upper surface of the electrode layer 102. For example, even in the electronic apparatus 110, the adhesion between the electrode layer 102 and the insulation layer 103 is degraded as a result of heat applied during a heat treatment in manufacturing, during testing such as a thermal cycle test, or during operation, and therefore, separation of the insulation layer 103 may occur.

In the light of features such as those mentioned above, herein, separation of an insulator portion from a conductor portion is suppressed by enhancing the adhesion between the conductor portion and the insulator portion in an electronic apparatus using methods such as those illustrated as embodiments below.

First, a first embodiment is described.

Figure 6:
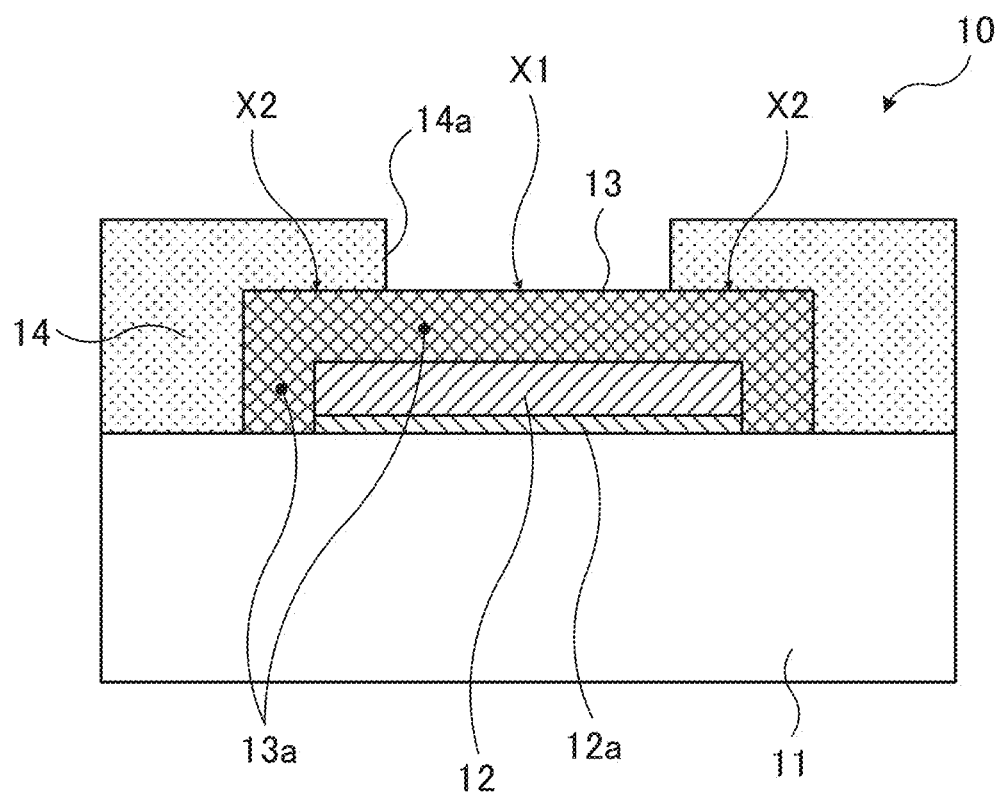
FIG. 6 is a view that illustrates an example of an electronic apparatus according to a first embodiment.

FIG. 6 is a view that illustrates an example of an electronic apparatus according to a first embodiment. In FIG. 6, a cross-section of a main portion of an example of an electronic apparatus according to a first embodiment is illustrated schematically.

An electronic apparatus 10 illustrated in FIG. 6 includes a substrate 11, an electrode layer 12, a porous conductor layer 13 and an insulation layer 14.

The electronic apparatus 10 is a semiconductor device such as a semiconductor package, or a circuit board that includes a semiconductor chip (a semiconductor element), or a semiconductor chip and a package substrate (a circuit board) on which the semiconductor chip is installed. Additionally, configuration examples of semiconductor devices and circuit boards are mentioned later (FIGS. 25A to 28B).

The substrate 11 is a main body of the electronic apparatus 10. Examples of the main body of the electronic apparatus 10 include a semiconductor substrate made of silicon (Si) on which an element such as a transistor is formed, a semiconductor substrate or a resin layer on which a wiring layer or a rewiring layer is formed, an inner layer (a layer on which a surface layer that includes the electrode layer 12 is formed) of a circuit board, and the like.

The electrode layer 12 is provided in a predetermined region of a predetermined substrate 11. The electrode layer 12 is electrically connected to a conductor section (not illustrated in the drawing) such as wiring or a via hole provided in an inner section of the substrate 11. For example, the electrode layer 12 is a land or a pad. Various conductor materials such as Cu, Ni and tungsten (W) are used in the electrode layer 12. Additionally, in FIG. 6, a case in which a seed layer 12a, which is used in the formation of the electrode layer 12, is provided below the electrode layer 12, is illustrated, for example.

A porous conductor material, which has pores 13a, is used in the porous conductor layer 13. The porous conductor layer 13 is provided to cover the surfaces (the upper surface and the side surfaces in this example) of the electrode layer 12. For example, the porous conductor layer 13 is provided as a barrier layer that suppresses diffusion and the formation of alloys (solid dispersions or intermetallic compounds) of components of the electrode layer 12 and solder provided above the electrode layer 12 when bonding the electronic apparatus 10 to another electronic apparatus. In this case, a conductor material in which the reaction with solder is slow in comparison with the conductor material of the electrode layer 12, or in other words, a conductor material with a small diffusion coefficient with respect to solder, is used in the porous conductor layer 13. For example, in a case in which Cu is used in the electrode layer 12, examples of conductor materials in which the diffusion coefficient with respect to solder is smaller than that of Cu include Ni, and the like, and the porous conductor layer 13 is formed using such as conductor material.

The insulation layer 14 includes an opening section 14a, which extends to a central section X1 of the porous conductor layer 13, and is provided on the surfaces (the upper surface and the side surfaces in this example) and inside the pores 13a at end sections X2 of the porous conductor layer 13 on the outer sides of the central section X1. The insulation layer 14 is not provided inside the pores 13a in the central section X1 of the porous conductor layer 13, and therefore, the pores 13a in the central section X1 are in an open state. For example, various resin materials that may be used as protective insulation layers such as passivation films, solder resists, and the like, may be used in the insulation layer 14. Examples of the resin materials that may be used in the insulation layer 14 include polyimide (PI), polybenzoxazole (PBO), and the like. In addition, materials in which an insulating filler such as silica is incorporated in a resin, and materials in which a fiber such as glass is incorporated in a resin may also be used in the insulation layer 14.

The details of a feature of a portion of the insulation layer 14 being provided in the porous conductor layer 13 and the pores 13a thereof are described.

In the electronic apparatus 10 according to the first embodiment, a terminal, which is provided with the electrode layer 12 and the porous conductor layer 13 provided on the surfaces thereof, is provided, and the insulation layer 14, which includes the opening section 14a that extends to the central section X1 of the porous conductor layer 13 of the terminal surfaces thereof, is provided as a protective insulation layer. As illustrated in FIG. 6, in the electronic apparatus 10, at the end sections X2 of the porous conductor layer 13, the insulation layer 14 is provided to cover the surfaces, and is also provided inside the pores 13a from the surfaces. As a result of a portion of the insulation layer 14 being provided inside the pores 13a of the porous conductor layer 13 in this manner, an anchoring effect of the insulation layer 14 may be realized, and therefore, the adhesion of the insulation layer 14 to the porous conductor layer 13 is enhanced.

Additionally, in FIG. 6, a single electrode layer 12, porous conductor layer 13 that covers the electrode layer 12, and an insulation layer 14, which includes the opening section 14a that extends to the porous conductor layer 13, are illustrated, for example, but such a structure may be provided on the substrate 11 in a predetermined plurality of regions.

In addition, in FIG. 6, a configuration in which the porous conductor layer 13 covers the upper surface and the side surfaces of the electrode layer 12 is illustrated, for example, but even in a configuration in which the porous conductor layer 13 covers the upper surface of the electrode layer 12 only, it is possible to enhance the adhesion of the insulation layer 14 as a result of an anchoring effect as mentioned above.

Next, a method of forming the electronic apparatus 10 is described using the configuration illustrated in FIG. 6 as an example.

FIGS. 7A to 13C are explanatory drawings of a method of forming an electronic apparatus according to the first embodiment. Hereinafter, an example of a method of forming an electronic apparatus according to the first embodiment is described with reference to FIGS. 7A to 13C.

FIGS. 7A to 7D are views that illustrate an example of an electrode layer formation process according to the first embodiment. In FIGS. 7A to 7D, cross-sections of main portions corresponding to an electrode layer formation process according to the first embodiment are illustrated schematically.

Figure 7A:
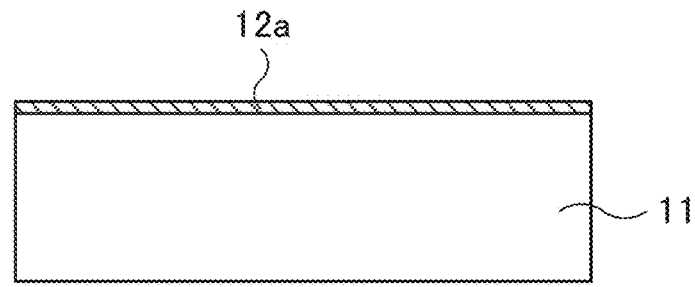
FIGS. 7A to 7D are explanatory drawings of a method of forming the electronic apparatus according to the first embodiment (1 of 7)

First, a substrate 11 (the main body of the electronic apparatus 10) as illustrated in FIG. 7A is prepared. Further, as illustrated in FIG. 7A, the seed layer 12a is formed by depositing Ti and Cu, for example, on the prepared substrate 11 using a sputtering method. The thickness of the seed layer 12a is not particularly limited as long as it is possible to perform electrolytic plating using the seed layer 12a as a power feed layer. However, as is described later, a site of the seed layer 12a exposed after the formation of the electrode layer 12 is removed by etching. In order to suppress a circumstance in which the etching takes a long time, it is preferable that the thickness of the seed layer 12a is set to 1 μm or less.

Figure 7B:
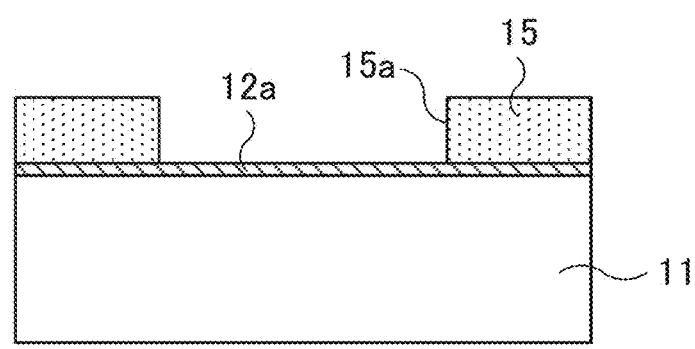

After the formation of the seed layer 12a, as illustrated in FIG. 7B, a photoresist 15 is formed, and an opening section 15a is formed in a region in which the electrode layer 12 is formed by carrying out exposure and development of the photoresist 15.

Figure 7C:
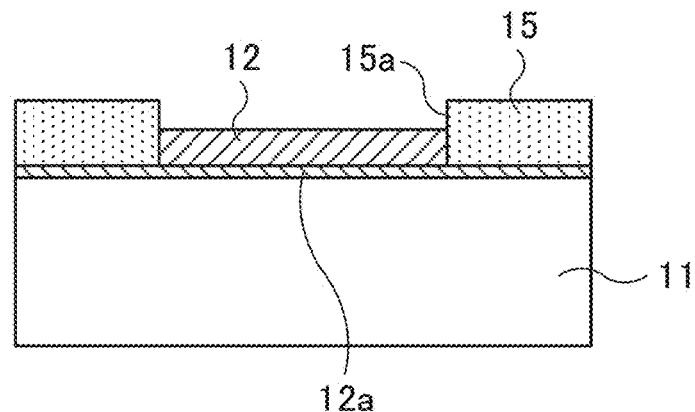

The electrode layer 12 is formed as illustrated in FIG. 7C by performing electrolytic plating of Cu or the like in which the seed layer 12a is used as a power feed layer with the photoresist 15, which includes the opening sections 15a, set as a mask.

Figure 7D:
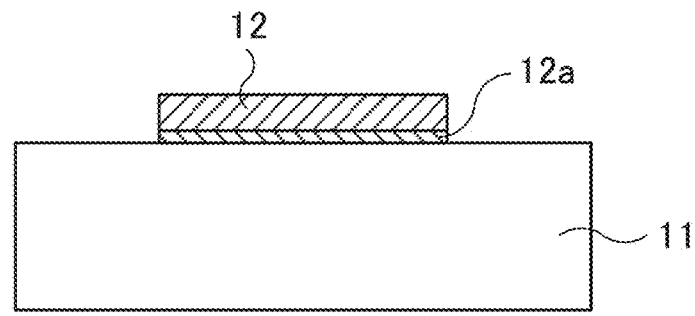

After the formation of the electrode layer 12, as illustrated in FIG. 7D, the photoresist 15 is removed, and the seed layer 12a exposed after the removal of the photoresist 15 is removed by etching.

In this manner, the electrode layer 12 (and the seed layer 12a) is formed on the substrate 11.

Figure 8:
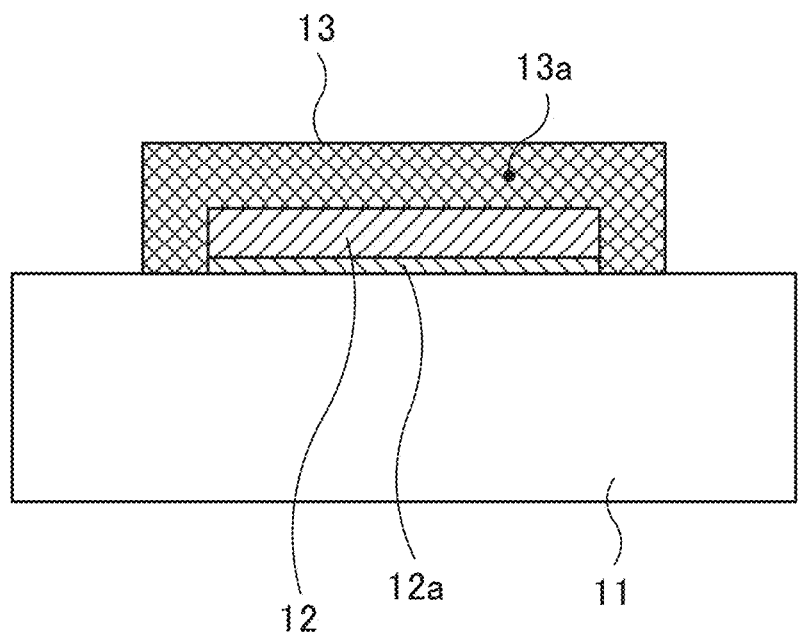
FIG. 8 is an explanatory drawing of a method of forming the electronic apparatus according to the first embodiment (2 of 7)

FIG. 8 is a view that illustrates an example of a porous conductor layer formation process according to the first embodiment. In FIG. 8, a cross-section of a main portion corresponding to a porous conductor layer formation process according to the first embodiment is illustrated schematically.

After the formation of the electrode layer 12, as illustrated in FIG. 8, the porous conductor layer 13 is formed on the surfaces (the upper surface and the side surfaces in this example) of the electrode layer 12. For example, a porous conductor layer 13, in which Ni is the main constituent, is formed on the surfaces of the electrode layer 12 using non-electrolytic plating.

Figure 9:
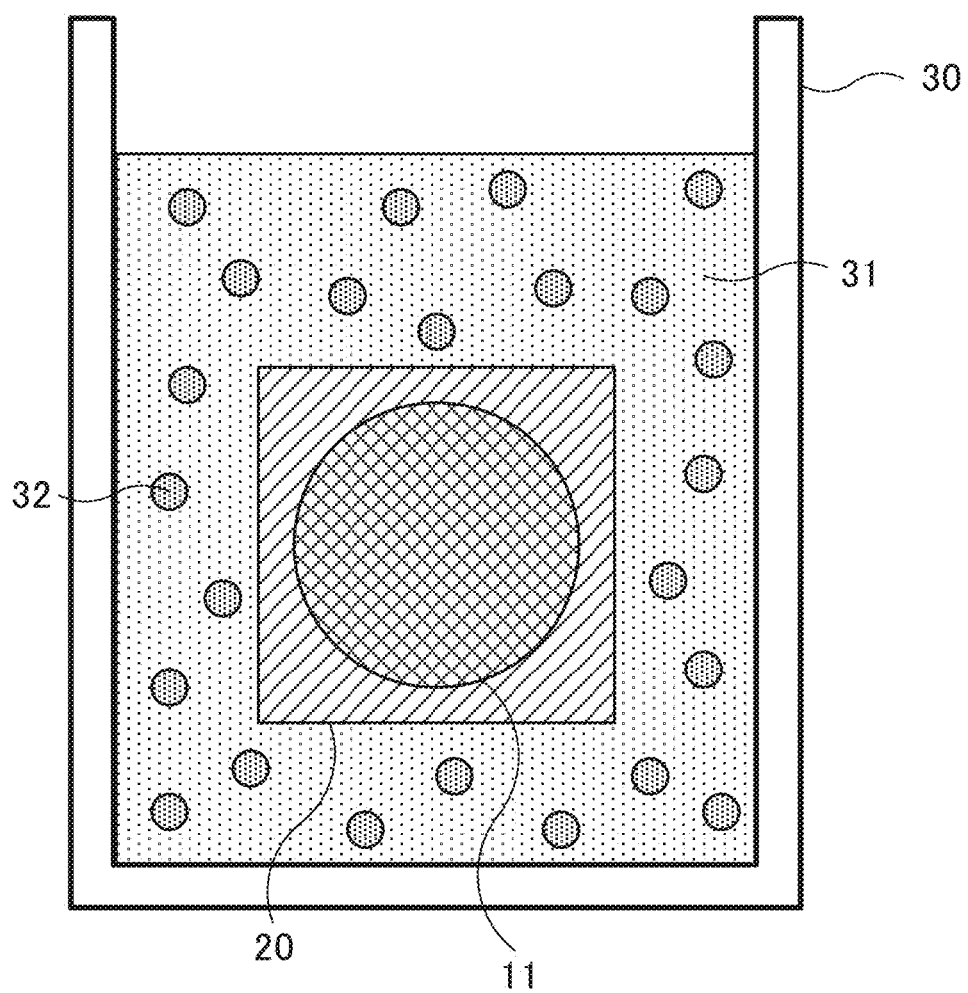
FIG. 9 is an explanatory drawing of a method of forming the electronic apparatus according to the first embodiment (3 of 7)

Herein, FIG. 9 is an explanatory drawing of a non-electrolytic plating process during porous conductor layer formation according to the first embodiment.

In the formation of the porous conductor layer 13 using non-electrolytic plating, first, as illustrated in FIG. 9, the substrate 11 on which formation up to the electrode layer 12 was performed, is set in a holder 20, and immersed in a predetermined plating solution 31 inside a plating tub 30.

For example, a solution that contains Ni and P, or a solution that contains Ni and B is used in the plating solution 31. In this case, since there is a tendency for the solderability to deteriorate as a P concentration of the porous conductor layer 13, which is used, increases, it is desirable that the P concentration of the plating solution 31 is set to 12% or less. In addition, since there is a tendency for a B concentration of the porous conductor layer 13, which is used, not to exert an effect on the solderability, the B concentration of the plating solution 31 is not particularly limited.

Resin particles 32 such as polytetrafluoroethylene (PTFE) are incorporated in the plating solution 31. For example, resin particles with an average particle size of 1 μm or less may be used in the resin particles 32.

The substrate 11 on which formation up to the electrode layer 12 was performed, is immersed in the plating solution 31, which contains the resin particles 32 and is set to a predetermined temperature, and non-electrolytic Ni—P plating, or non-electrolytic Ni—B plating is performed. In non-electrolytic Ni—P plating, the temperature of the plating solution 31 is, for example, set to 80° C. to 90° C. In non-electrolytic Ni—B plating, the temperature of the plating solution 31 is, for example, set to 50° C. to 65° C.

An Ni—P plating layer or an Ni—B plating layer, which contains the resin particles 32, is precipitated on the surfaces of the electrode layer 12 on the substrate 11 as a result of non-electrolytic plating. After the substrate 11 is pulled out of the plating tub 30, the incorporated resin particles 32 are selectively removed from the Ni—P plating layer or the Ni—B plating layer precipitated on the surfaces of the electrode layer 12. For example, the resin particles 32 are selectively removed from the Ni—P plating layer or the Ni—B plating layer by volatilizing the resin particles 32 using a heating treatment, dissolving the resin particles 32 using a chemical treatment, or the like depending on the material of the resin particles 32 that are used. By selectively removing the resin particles 32 from the Ni—P plating layer or the Ni—B plating layer, a porous conductor layer 13 in which sites at which the resin particles 32 are removed are set as the pores 13a, is formed.

From a viewpoint of realizing barrier properties (the suppression of interdiffusion of the components of the electrode layer 12 and the solder) during solder bonding, it is desirable that a porous conductor layer 13 with a thickness of 1 μm to 5 μm is formed.

Next, the porous conductor layer 13 and the formation thereof are described in further detail.

Figure 10:
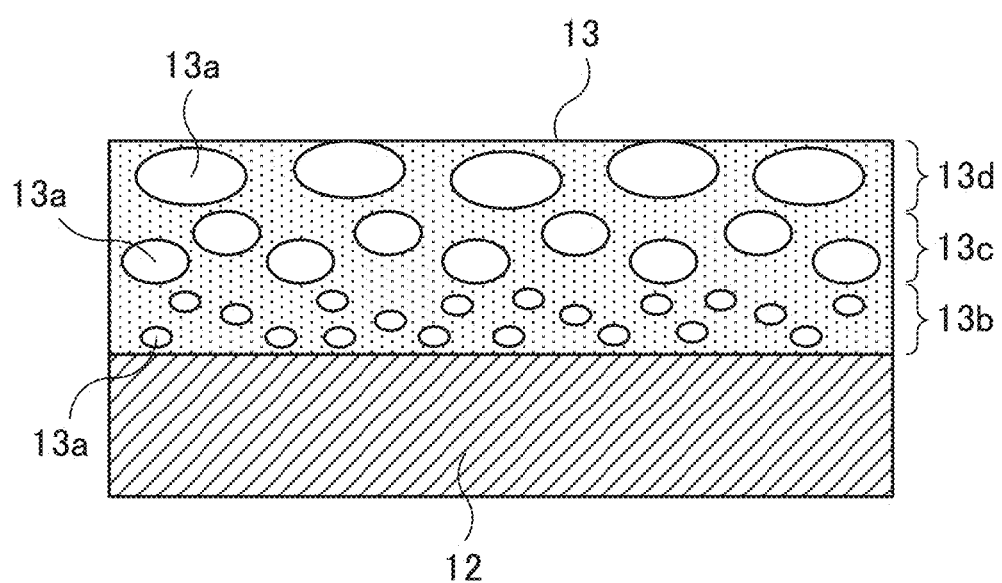
FIG. 10 is an explanatory drawing of a method of forming the electronic apparatus according to the first embodiment (4 of 7)

FIG. 10 is a view that illustrates an example of a porous conductor layer according to the first embodiment. In FIG. 10, a cross-section of a main portion of an example of a porous conductor layer according to the first embodiment that is formed on the surfaces of an electrode layer is illustrated schematically.

As illustrated in FIG. 10, the porous conductor layer 13 may be formed to have a pore distribution in which the sizes (average pore diameter (average diameter)) of the pores 13a thereof are relatively small on an electrode layer 12 side, and relatively large on a side of the surfaces of the porous conductor layer 13. For example, the porous conductor layer 13 is set to have a pore distribution in which the average diameter of the pores 13a thereof gradually becomes larger with progression toward the side of the surfaces from the electrode layer 12 side.

As one example, the average diameter of the pores 13a of the porous conductor layer 13 is approximately 0.2 μm in the vicinity of the electrode layer 12, and the average diameter of the pores 13a gradually becomes larger with progression toward the side of the surfaces. In a case in which the thickness of the porous conductor layer 13 is 1 μm, the average diameter of the pores 13a is approximately 1 μm in the vicinity of the surfaces, and in a case in which the thickness of the porous conductor layer 13 is 3 μm, the average diameter of the pores 13a is approximately 3 μm in the vicinity of the surfaces. In this manner, there is a tendency for the average diameter of the pores 13a to increase in the vicinity of the surfaces in substantially proportional to the thickness of the porous conductor layer 13.

For example, a porous conductor layer 13, which has a pore distribution as illustrated in FIG. 10 is formed in the following manner.

That is, if non-electrolytic plating is performed by immersing the substrate 11 on which formation up to the electrode layer 12 was performed, into the plating solution 31, which contains the resin particles 32, first, an Ni—P or Ni—B plating layer lower layer section 13b, which contains the resin particles 32, is precipitated in the vicinity of the surfaces of the electrode layer 12.

If non-electrolytic plating is further performed, an Ni—P or Ni—B plating layer intermediate layer section 13c, which contains the resin particles 32, is precipitated on the plating layer lower layer section 13b. Since the resin particles 32 are incorporated in the plating layer lower layer section 13b, which corresponds to a foundation of the porous conductor layer 13, in comparison with a case in which the resin particles 32 are not incorporated, an exposure area of Ni—P or Ni—B is small, and therefore, an area of regions in which it is possible for new Ni—P or Ni—B to grow is small. Therefore, in comparison with the plating layer lower layer section 13b, in the plating layer intermediate layer section 13c, which is precipitated on the plating layer lower layer section 13b, a volume that Ni—P or Ni—B occupy is reduced, and therefore, a volume that the resin particles 32 occupy is increased.

The same effect also applies to precipitating an Ni—P or Ni—B plating layer upper layer section 13d, which contains the resin particles 32, on the plating layer intermediate layer section 13c by further performing non-electrolytic plating. That is, in comparison with the plating layer intermediate layer section 13c, in the plating layer upper layer section 13d, which is precipitated on the plating layer intermediate layer section 13c, in which the exposure area of Ni—P or Ni—B is smaller than that of the plating layer lower layer section 13b, a volume that Ni—P or Ni—B occupy is reduced, and therefore, a volume that the resin particles 32 occupy is increased.

As a result of non-electrolytic plating continuing in this manner, Ni—P plating layers or Ni—B plating layers in which the volume that the resin particles 32 occupy increases in the order of the plating layer lower layer section 13b, the plating layer intermediate layer section 13c and the plating layer upper layer section 13d, are formed on the electrode layer 12. By selectively removing the resin particles 32 from such an Ni—P plating layer or Ni—B plating layer, a porous conductor layer 13 as illustrated in FIG. 10, which has a pore distribution in which the average diameter of the pores 13a increases approaching the surfaces from the inner section, is formed.

Additionally, in FIG. 10, a plating layer divided into the three layers of the plating layer lower layer section 13b, the plating layer intermediate layer section 13c, and the plating layer upper layer section 13d is illustrated as an example, but the number of divided layers is not limited three layers, and in addition, the plating layers are not necessarily plating layers that are clearly divided into a plurality of layers. The plating layers may be formed using a single non-electrolytic plating treatment, or may be formed using a plurality of non-electrolytic plating treatments. In a case in which the plating layers are formed using a plurality of non-electrolytic plating treatments, the sizes of the resin particles 32 that are incorporated in the plating solution 31, may be changed (the sizes of the resin particles 32 made larger during upper layer formation) each time.

After the formation of the porous conductor layer 13, formation of the insulation layer 14 is performed.

Figure 11A:
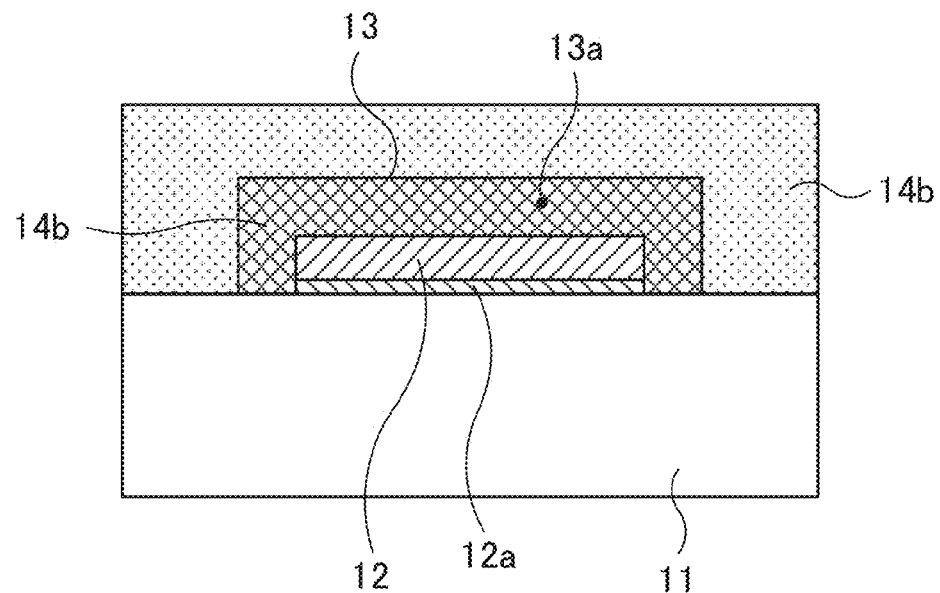
FIGS. 11A and 11B are explanatory drawings of a method of forming the electronic apparatus according to the first embodiment (5 of 7)
Figure 11B:
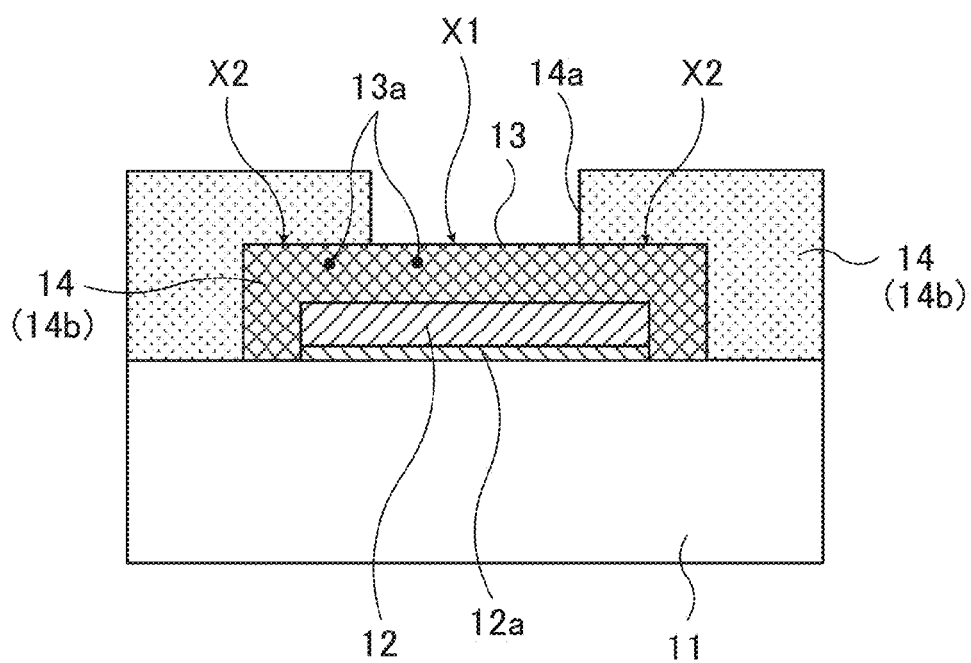

FIGS. 11A and 11B is a view that illustrates an example of an insulation layer formation process according to the first embodiment. In FIG. 11A, a cross-section of a main portion corresponding to an insulating material formation process according to the first embodiment is illustrated schematically. In FIG. 11B, a cross-section of a main portion corresponding to an opening section formation process according to the first embodiment is illustrated schematically.

First, as illustrated in FIG. 11A, an insulating material 14b is formed on the substrate 11 on which formation up to the porous conductor layer 13 was performed. For example, a photosensitive resin such as PI or PBO may be used in the insulating material 14b. An insulating filler, fiber, or the like, may be incorporated in a resin to be used as the insulating material 14b.

For example, the insulating material 14b is formed by coating the substrate 11 with a predetermined resin as above, and rebaking using heating equipment such as a hot plate. After the formation of the insulating material 14b, exposure and development is performed, and as illustrated in FIG. 11B, the opening section 14a that extends to the central section X1 of the porous conductor layer 13, is formed. In this manner, the insulation layer 14 is formed by solidifying the insulating material 14b in which the opening section 14a is formed, using a heat treatment in a low-oxygen atmosphere that uses an inert oven.

Figure 12A:
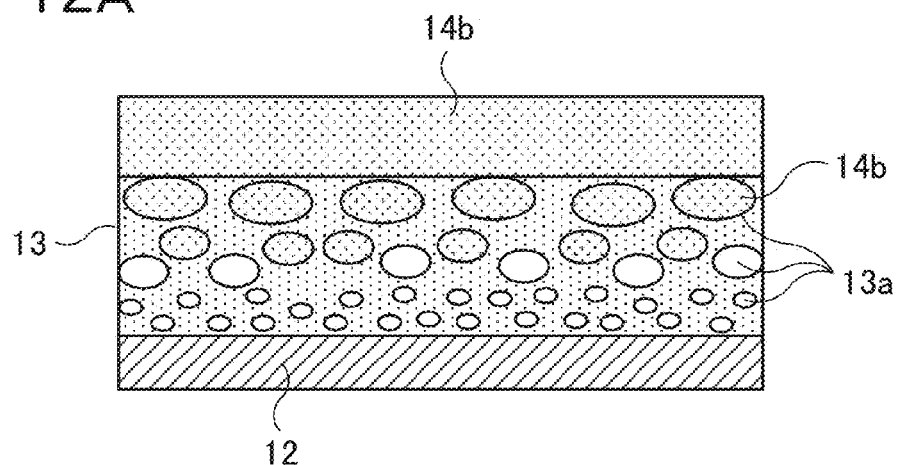
FIGS. 12A to 12C are explanatory drawings of a method of forming the electronic apparatus according to the first embodiment (6 of 7)
Figure 12B:
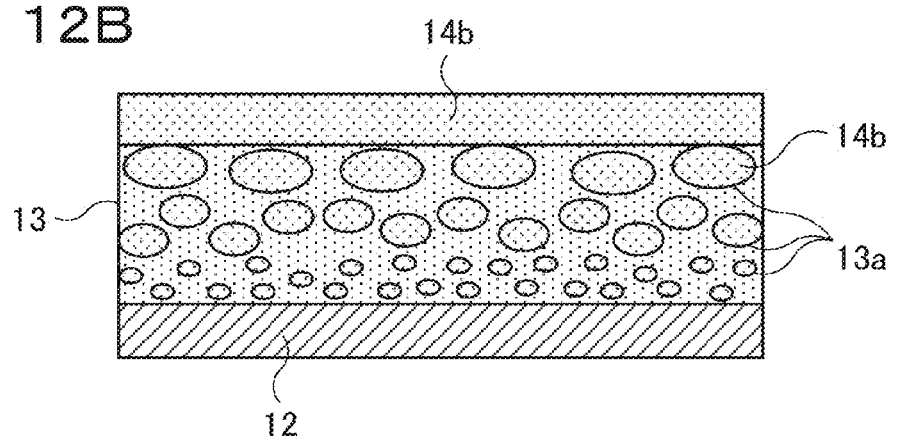
Figure 12C:
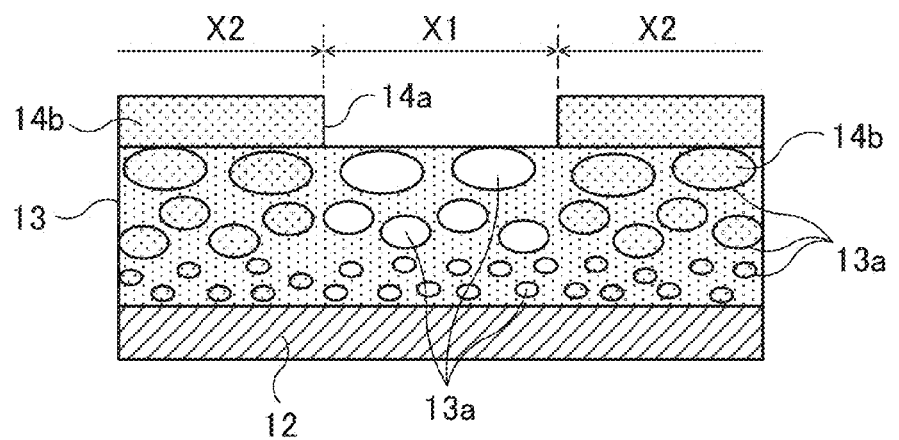

Herein, FIGS. 12A to 12C are explanatory drawings of an insulation layer formation process according to the first embodiment. In FIGS. 12A and 12B, cross-sections of main portions corresponding to an insulating material formation process according to the first embodiment are illustrated schematically. In FIG. 12C, a cross-section of a main portion corresponding to an opening section formation process according to the first embodiment is illustrated schematically.

When the insulating material 14b is formed (coated) on the substrate 11 in the manner of FIG. 11A, as illustrated in FIG. 12A and subsequently in FIG. 12B, the insulating material 14b formed on the surfaces of the porous conductor layer 13 infiltrates into the insides of the pores 13a from the surfaces of the insulating material 14b due to a capillary action. In this manner, the insulating material 14b is formed on the surfaces of the porous conductor layer 13 and inside the pores 13a. If, as described above, a porous conductor layer 13, which has a pore distribution in which the average diameter of the pores 13a of the surfaces is greater than that of the inner section, is formed, the infiltration of the insulating material 14b into the inside of the porous conductor layer 13 due to the capillary action proceeds with ease.

The opening section 14a, which extends to the central section X1 of the porous conductor layer 13, is formed as described in FIG. 11B above by performing exposure and development of the insulating material 14b formed on the surfaces of the porous conductor layer 13 and inside the pores 13a. As illustrated in FIG. 12C, as a result of exposure and development during the formation of the opening section 14a, the insulating material 14b formed on the surfaces in the central section X1 of the porous conductor layer 13 and the insulating material 14b formed inside the pores 13a in the central section X1 are removed. The insulating material 14b formed on the surfaces of and inside the pores 13a in the end sections X2 of the porous conductor layer 13 remain after formation of the opening section 14a.

In this manner, an insulation layer 14 (FIG. 11B and FIG. 12C), which includes the opening section 14a that extends to the central section X1 of the porous conductor layer 13, and which is provided on the surfaces of and inside the pores 13a in the end sections X2, is obtained. As a result of a portion thereof being provided inside the pores 13a of the porous conductor layer 13, the insulation layer 14 may be referred to as being integrated with the porous conductor layer 13. The insulation layer 14, a portion of which is provided inside the pores 13a of the porous conductor layer 13, adheres to the porous conductor layer 13 strongly as a result of the anchoring effect. As a result, even in a case in which heat or external forces are applied, it is possible to effectively suppress the separation of the insulation layer 14 from the porous conductor layer 13.

As a result of a method as mentioned above, an electronic apparatus 10 (FIG. 6) in which the adhesion of the insulation layer 14 is excellent, is formed.

Figure 13A:
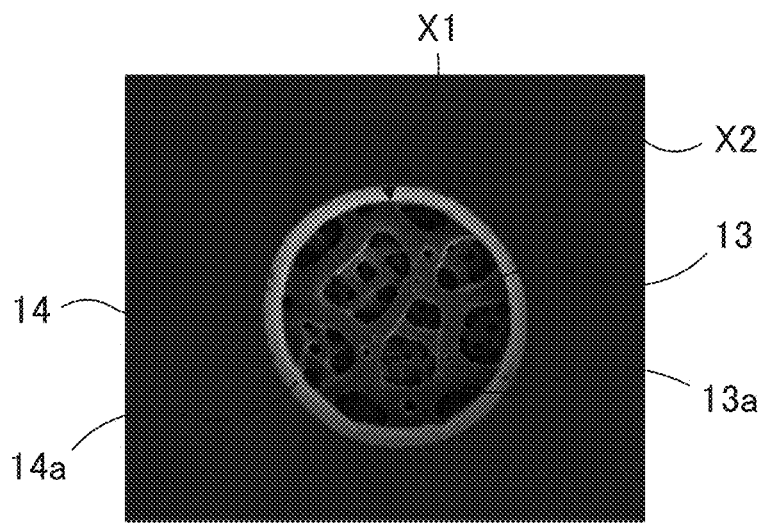
FIGS. 13A to 13C are explanatory drawings of a method of forming the electronic apparatus according to the first embodiment (7 of 7)
Figure 13B:
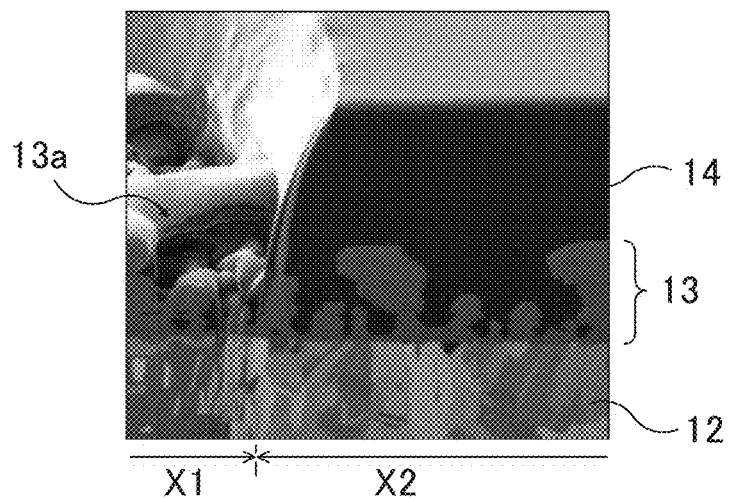
Figure 13C:
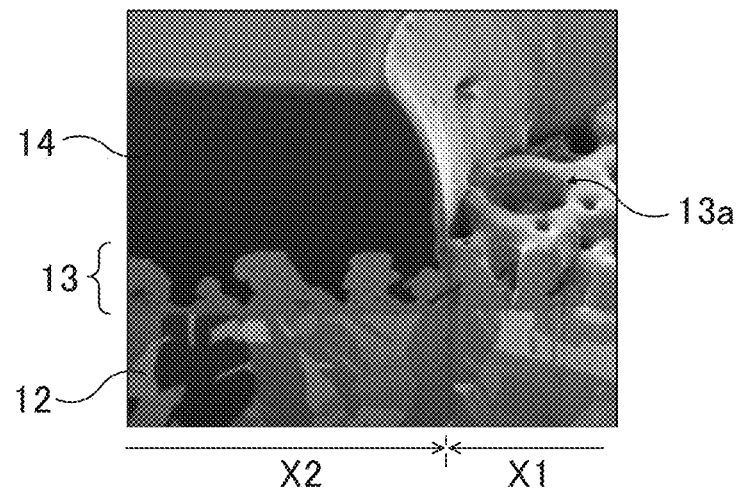

As one example, scanning ion microscopy (SIM) images obtained from an electronic apparatus according to the first embodiment is illustrated in FIGS. 13A to 13C. Additionally, the SIM images that are illustrated in FIGS. 13A to 13C are one example of SIM images that may be obtained from an electronic apparatus formed using the conditions illustrated in Example 1 mentioned above.

An example of a planar SIM image and an example of a cross-sectional SIM image obtained after the formation of the insulation layer 14, which includes the opening section 14a that extends to the porous conductor layer 13, are respectively illustrated in FIG. 13A and FIG. 13B. In addition, an example of a cross-sectional SIM image obtained after a heat treatment, is illustrated in FIG. 13C.

As illustrated in FIGS. 13A and 13B, the central section X1 of the porous conductor layer 13, which includes the pores 13a, is exposed in the opening section 14a of the insulation layer 14, and the insulation layer 14 is infiltrated into the surfaces of and inside the pores 13a in the end sections X2 of the porous conductor layer 13. The insulation layer 14 (the insulating material 14b) of the pores 13a in the central section X1 of the porous conductor layer 13 exposed from the opening section 14a is removed. Even if a heat treatment is performed using predetermined conditions after the formation of the insulation layer 14, as illustrated in FIG. 13C, separation of the insulation layer 14 from the porous conductor layer 13 is not observed.

As described above, in the electronic apparatus 10 according to the first embodiment, the porous conductor layer 13 is provided on the surfaces of the electrode layer 12. Further, a portion of the insulation layer 14, which includes the opening section 14a that extends to the central section X1 of the porous conductor layer 13, that is, a portion of the insulation layer 14 that covers the end sections X2 of the porous conductor layer 13, is provided inside the pores 13a of the porous conductor layer 13. As a result, an anchoring effect of the insulation layer 14 is realized, and an electronic apparatus 10 in which the adhesion of the insulation layer 14 is excellent, may be realized.

For example, the electronic apparatus 10 may be bonded to other electronic apparatuses using solder. In this case, the solder is bonded to the porous conductor layer 13, which is exposed from the opening section 14a of the insulation layer 14 on an electronic apparatus 10 side. The porous conductor layer 13 has a barrier function, and suppresses the interdiffusion of components between the electrode layer 12 and the solder. As a result, it is possible to obtain a solder bonding section with a fixed bonding strength. Additionally, there are cases in which a portion of the solder infiltrates inside the pores 13a of the porous conductor layer 13. Even in such a case, it is possible to obtain the same effect as that mentioned above as a result of the porous conductor layer 13 having a barrier function.

Next, a second embodiment is described.

Figure 14:
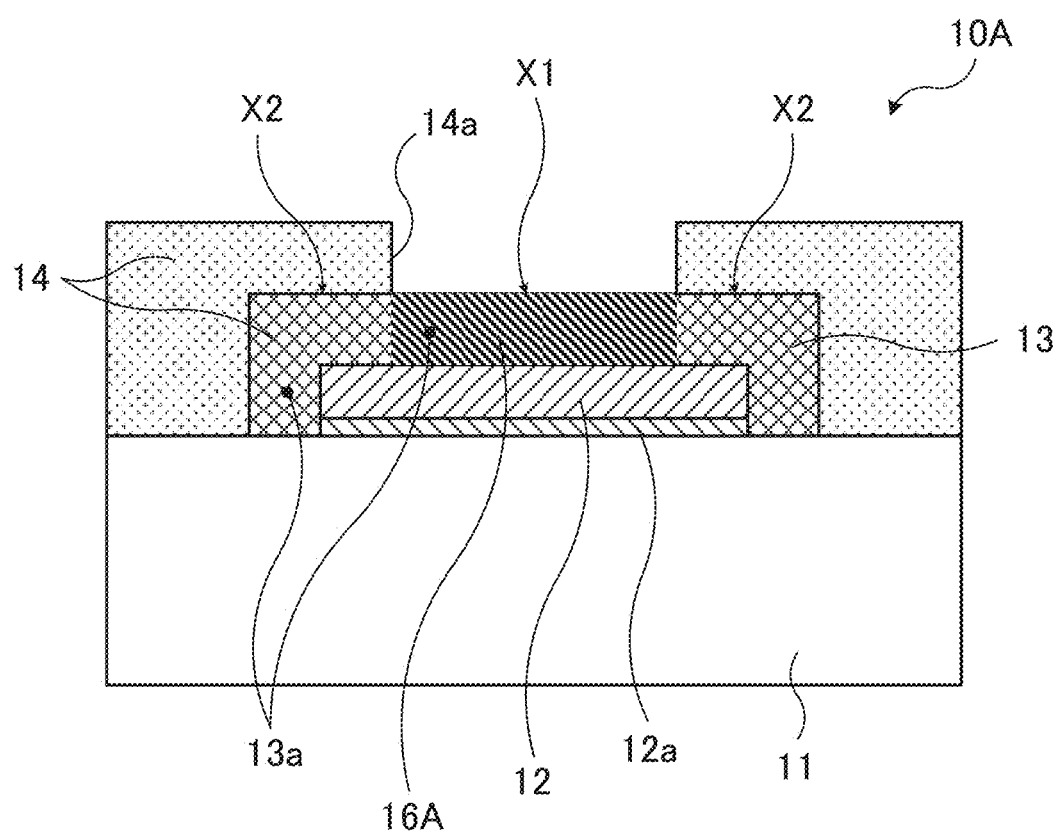
FIG. 14 is a view that illustrates an example of an electronic apparatus according to a second embodiment.

FIG. 14 is a view that illustrates an example of an electronic apparatus according to a second embodiment. FIG. 14 schematically illustrates a cross-section of a main portion of an example of an electronic apparatus according to a second embodiment.

An electronic apparatus 10A illustrated in FIG. 14 differs from the above-mentioned electronic apparatus 10 according to the first embodiment in that a conductor section 16A is provided inside the pores 13a in the central section X1 of the porous conductor layer 13 exposed from the opening section 14a of the insulation layer 14.

A conductor material that forms an alloy with the solder that is used when bonding the electronic apparatus 10A to another electronic apparatus, may be used in the conductor section 16A, which is provided inside the pores 13a in the central section X1 of the porous conductor layer 13. For example, a conductor material in which the diffusion coefficient with respect to solder is the same as, to a similar extent to, or larger than that of the conductor material of the porous conductor layer 13, may be used in the conductor section 16A. Cu, Ni, silver (Ag), Au, or the like may be used in the conductor section 16A.

For example, the electronic apparatus 10A is formed in the following manner.

Figure 15:
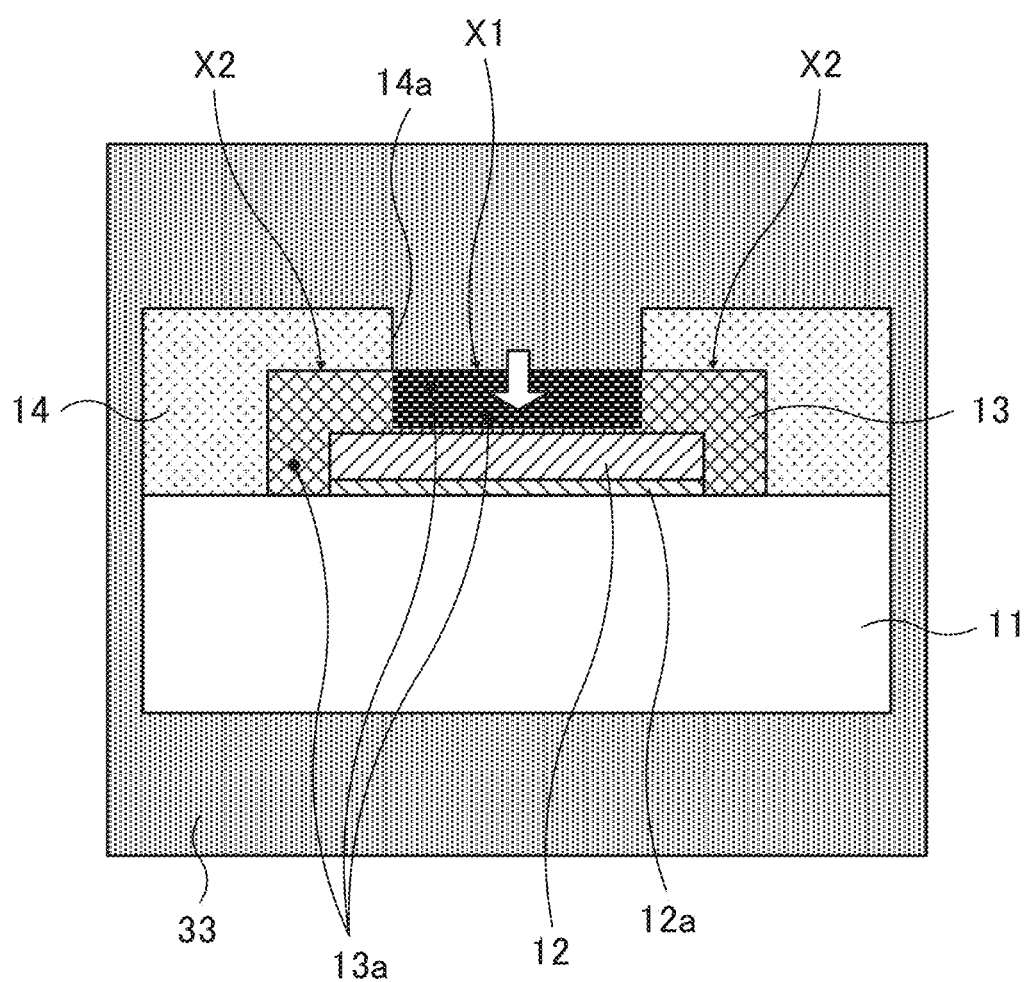
FIG. 15 is an explanatory drawing of a method of forming the electronic apparatus according to the second embodiment (1 of 2)
Figure 16:
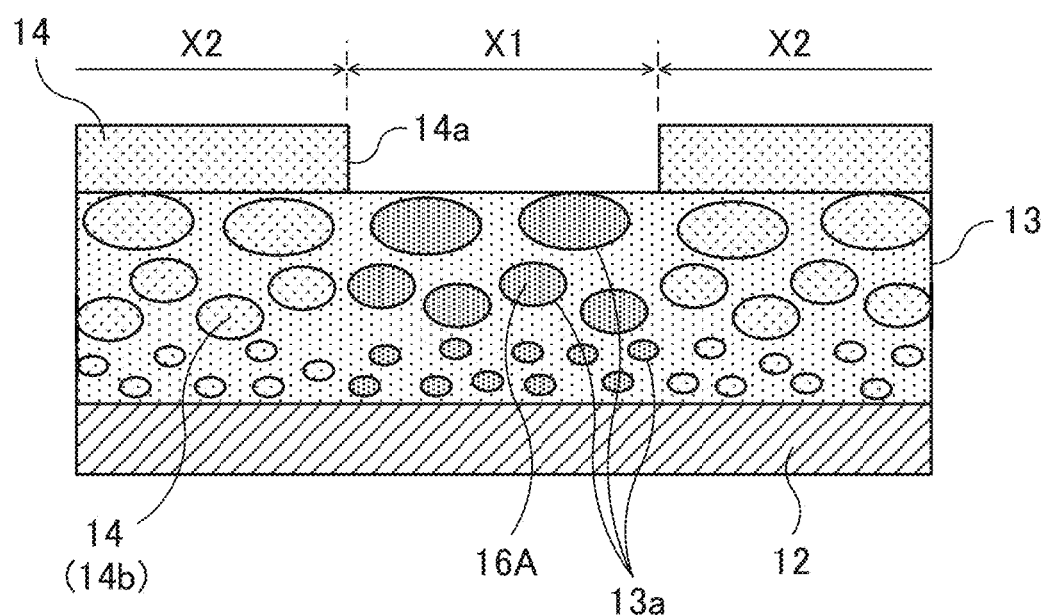
FIG. 16 is an explanatory drawing of a method of forming the electronic apparatus according to the second embodiment (2 of 2)

FIGS. 15 and 16 are explanatory drawings of a method of forming an electronic apparatus according to the second embodiment. In FIGS. 15 and 16, cross-sections of main portions corresponding to a non-electrolytic plating process according to the second embodiment are illustrated schematically.

In the formation of the electronic apparatus 10A, non-electrolytic plating is performed after the formation of the insulation layer 14, which includes the opening section 14a, as mentioned above using FIGS. 11A to 12C for the formation of the electronic apparatus 10. At this time, as illustrated in FIG. 15, the substrate 11 (the above-mentioned electronic apparatus 10) on which formation up to the insulation layer 14, which includes the opening section 14a, was performed, is immersed in a plating solution 33, which contains predetermined components that are used in the conductor section 16A such as Cu, Ni, Ag, Au or the like. The plating solution 33 infiltrates into the inside of the pores 13a in the central section X1 of the porous conductor layer 13 exposed from the opening section 14a of the insulation layer 14, as a result of a capillary action (illustrated by a bold arrow in FIG. 15). As a result of the plating solution 33 infiltrating into the inside of the pores 13a in the central section X1 of the porous conductor layer 13, as illustrated in FIG. 16, the conductor section 16A is formed (precipitated) inside the pores 13a in the central section X1.

For example, the conductor section 16A is formed such that an extent equivalent to the thickness in the central section X1 of the porous conductor layer 13 exposed from the opening section 14a of the insulation layer 14, or in other words, all of the pores 13a in the central section X1 are filled with the conductor section 16A.

In the same manner as the electronic apparatus 10 according to the first embodiment, in the electronic apparatus 10A according to the second embodiment, the porous conductor layer 13 is also provided on the surfaces of the electrode layer 12. Further, a portion of the insulation layer 14, which covers the end sections X2 of the porous conductor layer 13, is provided inside the pores 13a of the porous conductor layer 13. As a result, an anchoring effect of the insulation layer 14 is realized, and an electronic apparatus 10A in which the adhesion of the insulation layer 14 is excellent, may be realized.

Furthermore, in the electronic apparatus 10A according to the second embodiment, the conductor section 16A is provided inside the pores 13a in the central section X1 of the porous conductor layer 13 exposed from the opening section 14a of the insulation layer 14. Herein, when the conductor section 16A, which forms an alloy with the solder that is used in bonding with another electronic apparatus, is used, the components of the conductor section 16A are used in alloy formation with the solder, and therefore, the diffusion of solder components to the electrode layer 12, and the diffusion of electrode components from the electrode layer 12, are suppressed. As a result, degradation of the electrode layer 12 and the like, is suppressed. In addition, a solder bonding section with a fixed bonding strength may be obtained as a result of alloy formation of the conductor section 16A and the solder.

As described above, in the electronic apparatus 10A according to the second embodiment, the separation of the insulation layer 14 is effectively suppressed as a result of the anchoring effect due to a portion of the foundation of the insulation layer 14 being infiltrated into the inside of the pores 13a of the porous conductor layer 13. Furthermore, in the electronic apparatus 10A, the interdiffusion of components between the electrode layer 12 and solder that is used in bonding with other electronic apparatuses, is effectively suppressed by the porous conductor layer 13, which has a barrier function, and the conductor section 16A inside the pores 13a of the porous conductor layer 13.

Additionally, in the electronic apparatus 10A according to the second embodiment, the conductor section 16A, which is provided inside the pores 13a in the central section X1 of the porous conductor layer 13, is not limited to a single type.

Figure 17A:
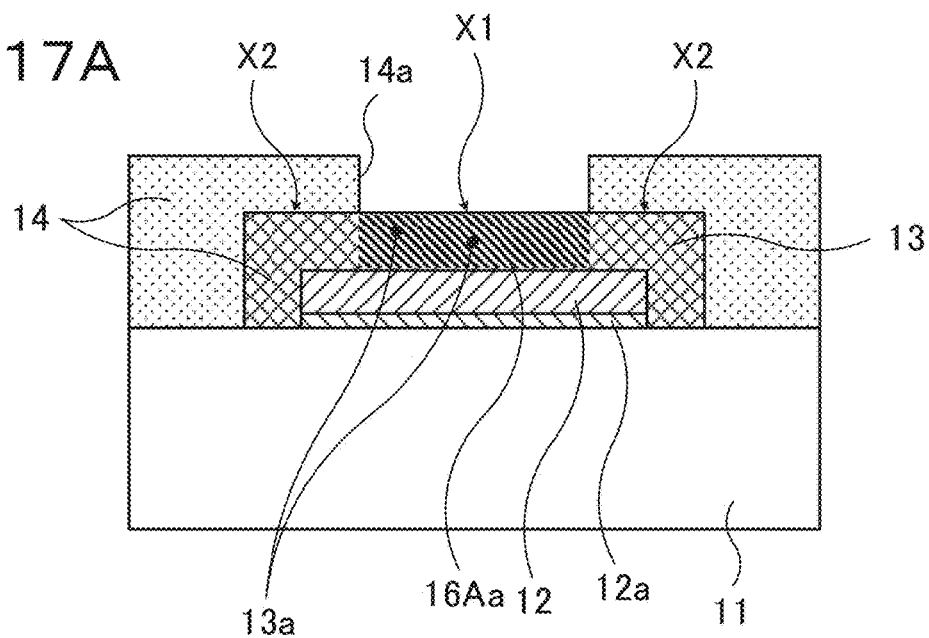
FIGS. 17A and 17B are views that illustrate another example of a method of forming the electronic apparatus according to the second embodiment.
Figure 17B:
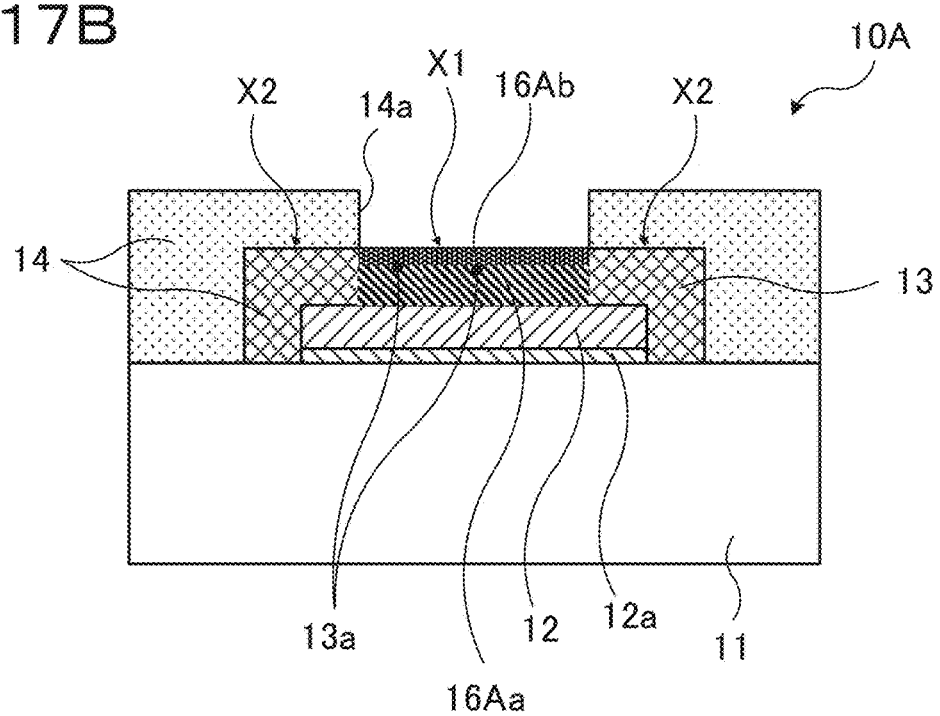

FIGS. 17A and 17B are views that illustrate another example of a method of forming an electronic apparatus according to the second embodiment. In FIG. 17A, a cross-section of a main portion corresponding to a first conductor material formation process according to the second embodiment is illustrated schematically. In FIG. 17B, a cross-section of a main portion corresponding to a second conductor material formation process according to the second embodiment is illustrated schematically.

In this example, after the formation of the insulation layer 14, which includes the opening section 14a, first, as illustrated in FIG. 17A, a first conductor section 16Aa is formed inside the pores 13a in the central section X1 of the porous conductor layer 13 to an extent equivalent to a thickness that falls below the thickness of the central section X1. The first conductor section 16Aa is formed using non-electrolytic plating. For example, Cu, Ni, or Ag may be used in the first conductor section 16Aa.

After the formation of the first conductor section 16Aa, as illustrated in FIG. 17B, a second conductor section 16Ab is formed inside the remaining pores 13a in the central section X1 of the porous conductor layer 13 in which the first conductor section 16Aa is not formed. The second conductor section 16Ab is formed using non-electrolytic plating. For example, Au may be used in the second conductor section 16Ab.

As described in this example, the two types of the first conductor section 16Aa and the second conductor section 16Ab may be provided inside the pores 13a in the central section X1 of the porous conductor layer 13, as the conductor section 16A. Additionally, herein, the two types of the first conductor section 16Aa and the second conductor section 16Ab are illustrated as an example, but three or more types of conductor material may be provided as the conductor section 16A.

In addition, in the electronic apparatus 10A, it is possible to embed a single type or two or more types of conductor section in all of the pores 13a in the central section X1 of the porous conductor layer 13, and further form a single type or two or more types of conductor section on the porous conductor layer 13 and on the conductor section that is embedded in all of the pores 13a in the central section X1 of the porous conductor layer 13.

Next, a third embodiment is described.

Figure 18:
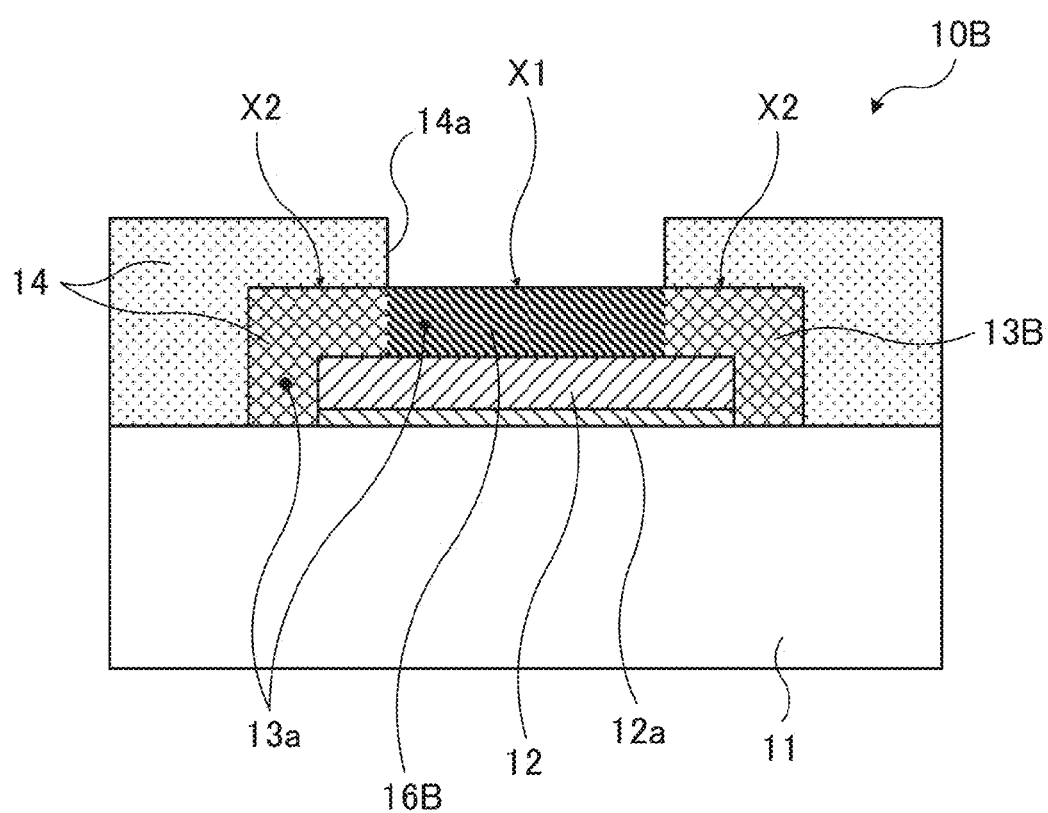
FIG. 18 is a view that illustrates an example of an electronic apparatus according to a third embodiment.

FIG. 18 is a view that illustrates an example of an electronic apparatus according to a third embodiment. In FIG. 18, a cross-section of a main portion of an example of an electronic apparatus according to a third embodiment is illustrated schematically.

An electronic apparatus 10B illustrated in FIG. 18 is provided with a porous conductor layer 13B, in which a conductor material that forms an alloy with the solder that is used in bonding with other electronic apparatuses, is used, and a conductor section 16B, which is provided inside the pores 13a in the central section X1 of the porous conductor layer 13B, and has a barrier function. Herein, a conductor material in which the diffusion coefficient with respect to solder is the same as, to a similar extent to, or larger than that of the conductor material of the electrode layer 12, may be used in the porous conductor layer 13B. A conductor material in which the diffusion coefficient with respect to solder is smaller than that of the conductor material of the porous conductor layer 13B, may be used in the conductor section 16B. For example, Cu, Ag, or the like may be used in the porous conductor layer 13B, and Ni, or the like may be used in the conductor section 16B. This is the difference between the electronic apparatus 10B and the electronic apparatus 10A according to the second embodiment.

The electronic apparatus 10B is formed in accordance with the examples of the methods that are described in the above-mentioned first and second embodiments.

That is, herein, the porous conductor layer 13B is formed using non-electrolytic plating of Cu, or the like, on the substrate 11 on which formation up to the electrode layer 12 was performed in accordance with the above-mentioned example of FIGS. 7A to 7D. For example, in a case in which the porous conductor layer 13B is formed using non-electrolytic plating of Cu, the substrate 11 on which formation up to the electrode layer 12 was performed, is immersed in a plating solution that contains a polyacetylene glycol-based additive in addition to a Cu component. As a result, a Cu porous conductor layer 13B, which has pores 13a with an average diameter of 1 µm or less, is formed.

In addition, the porous conductor layer 13B may be formed in accordance with the example of FIGS. 8 and 9. In this case, pores 13a that, in the same manner as FIG. 10 above, have a pore distribution in which the in which the average diameter increases approaching the surfaces from the inner section, may be formed on the porous conductor layer 13B.

After the formation of the porous conductor layer 13B, the insulation layer 14 is formed in accordance with the above-mentioned example of FIGS. 11A to 12C. During the formation of the insulation layer 14, the insulating material 14b, which is formed (coated) on the substrate 11, infiltrates into the inside of the pores 13a of the porous conductor layer 13B as a result of a capillary action. Further, the insulation layer 14, which includes the opening section 14a, is formed as a result of the insulating material 14b on the surfaces and inside the pores 13a in the central section X1 of the porous conductor layer 13B being removed.

After the formation of the insulation layer 14, herein, the conductor section 16B is formed inside the pores 13a in the central section X1 of the porous conductor layer 13B exposed from the opening section 14a of the insulation layer 14, in accordance with the above-mentioned example of FIGS. 14 to 16 using non-electrolytic plating of Ni—P, Ni—B or the like. A plurality of types of conductor material may be formed inside the pores 13a in the central section X1 of the porous conductor layer 13B, as the conductor section 16B in accordance with the above-mentioned example of FIGS. 17A and 17B. For example, Ni—P, Ni—B or the like may be formed inside the pores 13a in the central section X1 of the porous conductor layer 13B to an extent equivalent to a thickness that falls below the thickness of the central section X1, and Au may be formed inside the pores 13a in which Ni—P, Ni—B or the like is not formed. In this manner, a conductor section 16B that includes a plurality of types of component, is formed.

For example, an electronic apparatus 10B as illustrated in FIG. 18 is formed using such a method.

In addition, a sintered body may be used in the porous conductor layer 13B. In a case in which a sintered body is used in the porous conductor layer 13B, a resin composition (paste) that contains a predetermined conductor powder is printed onto the surfaces of the electrode layer 12 using a mask, and a sintered body of the conductor powder is formed by carrying out a heat treatment on the resin composition at a temperature at which the resin evaporates and the conductor powder becomes sintered. For example, an Ag paste, which contains Ag particles with an average particle size of 0.1 µm to 1 µm, is printed on the surfaces of the electrode layer 12 using a metal mask, and a porous Ag sintered body is formed by carrying out a heat treatment on the Ag paste at a predetermined temperature. After a porous conductor layer 13B made of such a sintered body is formed, the electronic apparatus 10B is obtained by performing the formation of the insulation layer 14, which includes the opening section 14a, and the formation of the conductor section 16B.

In the electronic apparatus 10B according to the third embodiment, excellent adhesion due to the anchoring effect of the insulation layer 14, is obtained as a result of providing the porous conductor layer 13B on the surfaces of the electrode layer 12, and providing a portion of the insulation layer 14, which covers the end sections X2 of the porous conductor layer 13B, inside the pores 13a of the porous conductor layer 13B. Herein, a substance that forms an alloy with the solder that is used in bonding with other electronic apparatuses comparatively easily in comparison with the conductor section 16B, is used in the porous conductor layer 13B. As a result, components of the porous conductor layer 13B are used in alloy formation with the solder, the diffusion of solder components to the electrode layer 12, and the diffusion of electrode components from the electrode layer 12, are suppressed, and therefore, degradation of the electrode layer 12 and the like is suppressed. In addition, a solder bonding section with a fixed bonding strength may be obtained as a result of alloy formation of the porous conductor layer 13B and the solder.

Furthermore, in the electronic apparatus 10B according to the third embodiment, the conductor section 16B is provided inside the pores 13a in the central section X1 of the porous conductor layer 13B exposed from the opening section 14a of the insulation layer 14. Herein, a substance that is less likely to form an alloy with the solder than the porous conductor layer 13B is used in the conductor section 16B. As a result, the conductor section 16B exhibits a barrier function. A conductor section 16B that has such a barrier function is, as described above, formed inside the pores 13a of the porous conductor layer 13B using non-electrolytic plating, for example. In this case, the surface area of the porous conductor layer 13B is greater than that of the conductor layer, which is not porous, and therefore, a formation probability of a core desired in the growth of the conductor section 16B is high. Therefore, even if the opening section 14a of the insulation layer 14 has a comparatively microscopic opening size such a diameter of 20 μm or less, it is possible to provide a site that has a barrier function, that is, the conductor section 16B, inside the opening section 14a.

As described above, in the electronic apparatus 10B according to the third embodiment, the separation of the insulation layer 14 is effectively suppressed as a result of the anchoring effect due to a portion of the foundation of the insulation layer 14 being infiltrated into the inside of the pores 13a of the porous conductor layer 13B. Furthermore, in the electronic apparatus 10B, the interdiffusion of components between the electrode layer 12 and the solder is effectively suppressed by the porous conductor layer 13B and the conductor section 16B, which is provided inside the pores 13a of the porous conductor layer 13B, and has a barrier function.

Next, a fourth embodiment is described.

Figure 19:
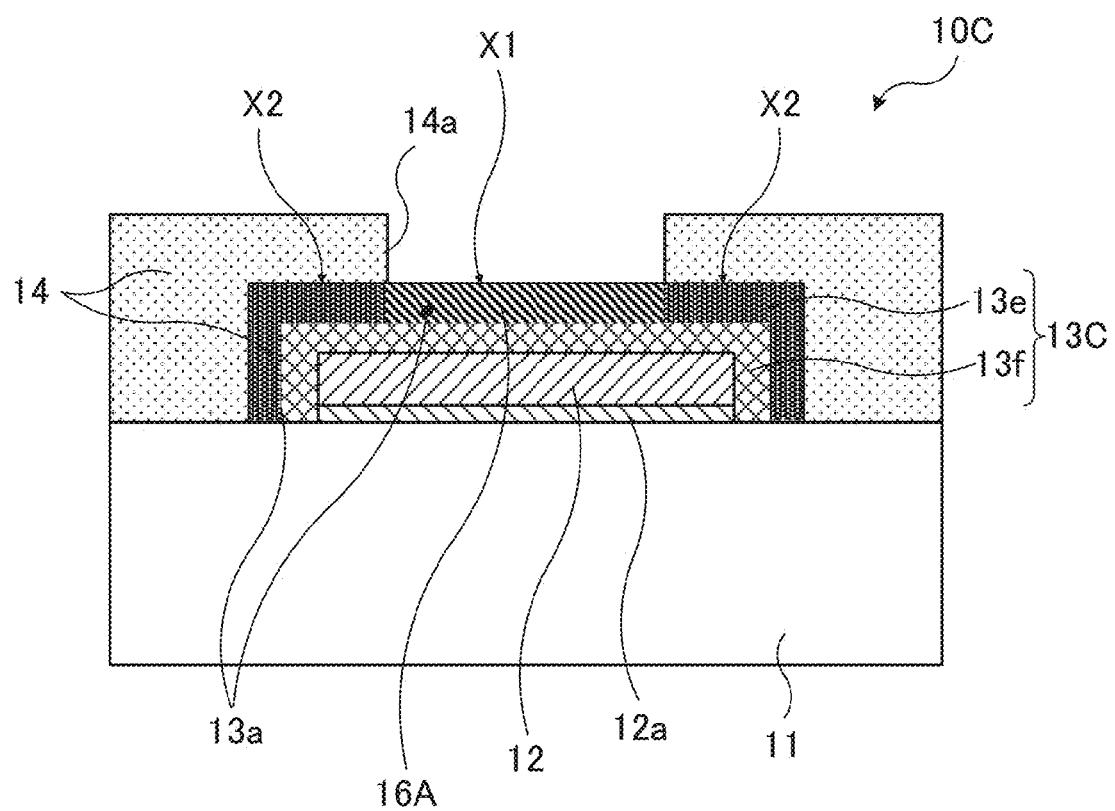
FIG. 19 is a view that illustrates an example of an electronic apparatus according to a fourth embodiment.

FIG. 19 is a view that illustrates an example of an electronic apparatus according to a fourth embodiment. In FIG. 19, a cross-section of a main portion of an example of an electronic apparatus according to a fourth embodiment is illustrated schematically.

An electronic apparatus 10C illustrated in FIG. 19 differs from the above-mentioned electronic apparatus 10A according to the second embodiment in that a porous conductor layer 13C, which includes a site with a porous property (a porous section) 13e on an insulation layer 14 side, and a site with a non-porous property (a non-porous section) 13f on an electrode layer 12 side, is provided. In the electronic apparatus 10C, the conductor section 16A is provided inside the pores 13a of the porous section 13e of the porous conductor layer 13C exposed from the opening section 14a of the insulation layer 14.

Such a porous conductor layer 13C of the electronic apparatus 10C may be obtained by first, forming the non-porous section 13f after forming the electrode layer 12 on the substrate 11 in accordance with the example of FIGS. 7A to 7D, and subsequently forming the porous section 13e. Herein, for example, the non-porous section 13f may be formed using non-electrolytic plating of Ni—P, Ni—B or the like. Furthermore, in addition to such a non-electrolytic plating method, the non-porous section 13f may be formed using various film formation (deposition) methods such as electrolytic plating or a sputtering method. The porous section 13e may be formed by performing non-electrolytic plating of Ni—P, Ni—B or the like on the substrate 11 on which formation up to the non-porous section 13f was performed, in accordance with the above-mentioned example illustrated in FIGS. 8 to 10.

It is also possible to obtain that same effects as those mentioned above for the above-mentioned electronic apparatus 10A according to the second embodiment using the electronic apparatus 10C according to the fourth embodiment. Even if a contact site of the electrode layer 12 is set to be the non-porous section 13f as in the porous conductor layer 13C of the electronic apparatus 10C, it is possible to effectively suppress separation of the insulation layer 14 as a result of an anchoring effect due to a portion of the foundation of the insulation layer 14 being infiltrated into the inside of the pores 13a of the porous section 13e.

Next, a fifth embodiment is described.

Figure 20:
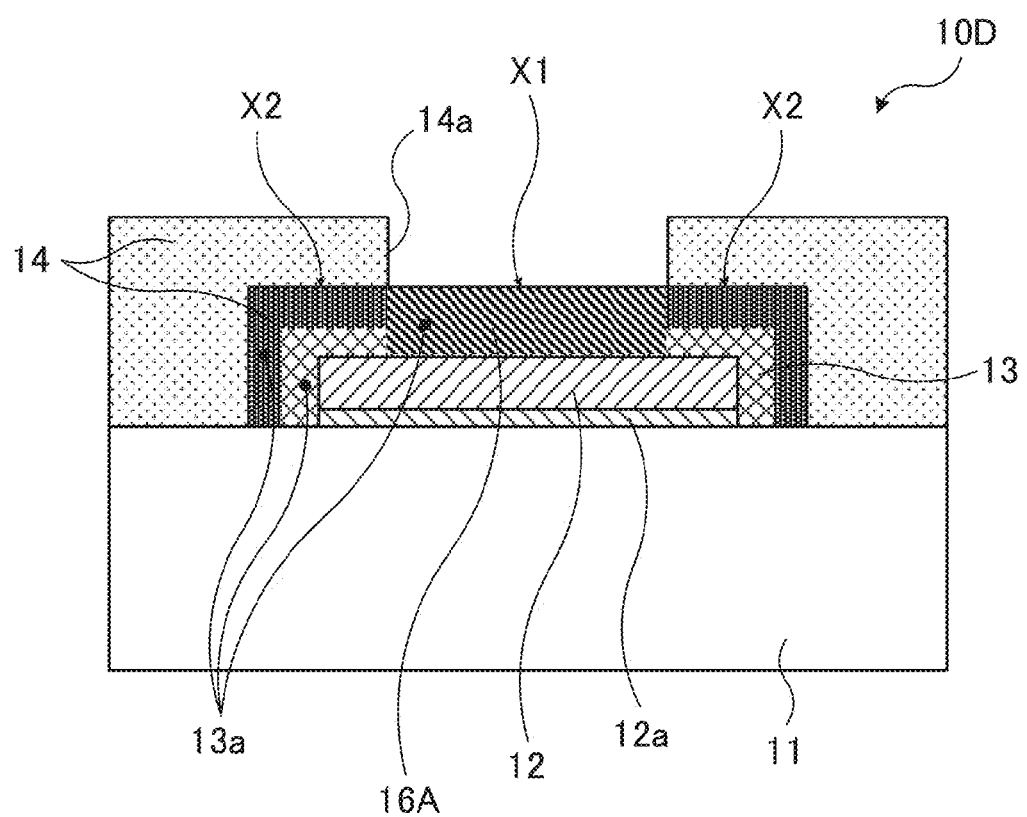
FIG. 20 is a view that illustrates an example of an electronic apparatus according to a fifth embodiment.

FIG. 20 is a view that illustrates an example of an electronic apparatus according to a fifth embodiment. In FIG. 20, a cross-section of a main portion of an example of an electronic apparatus according to a fifth embodiment is illustrated schematically.

An electronic apparatus 10D illustrated in FIG. 20 differs from the above-mentioned electronic apparatus 10A according to the second embodiment in that there are pores 13a in a state in which the insulation layer 14 is not provided in the holes thereof, on the electrode layer 12 side of the porous conductor layer 13.

Such an electronic apparatus 10D may be formed by causing the insulating material 14b of the insulation layer 14 to infiltrate into a region of a depth that does not reach the electrode layer 12 inside of the porous conductor layer 13 from a surface side thereof, when forming the insulation layer 14 in accordance with the above-mentioned example of FIGS. 11A to 12C. An infiltration depth of the insulating material 14b may be adjusted using the viscosity and coating amount of the insulating material 14b, the time from coating to the initiation of prebaking, the sizes and the pore distribution of the pores 13a of the porous conductor layer 13 and the like.

It is also possible to obtain that same effects as those mentioned above for the above-mentioned electronic apparatus 10A according to the second embodiment using the electronic apparatus 10D according to the fifth embodiment.

Next, a sixth embodiment is described.

Figure 21:
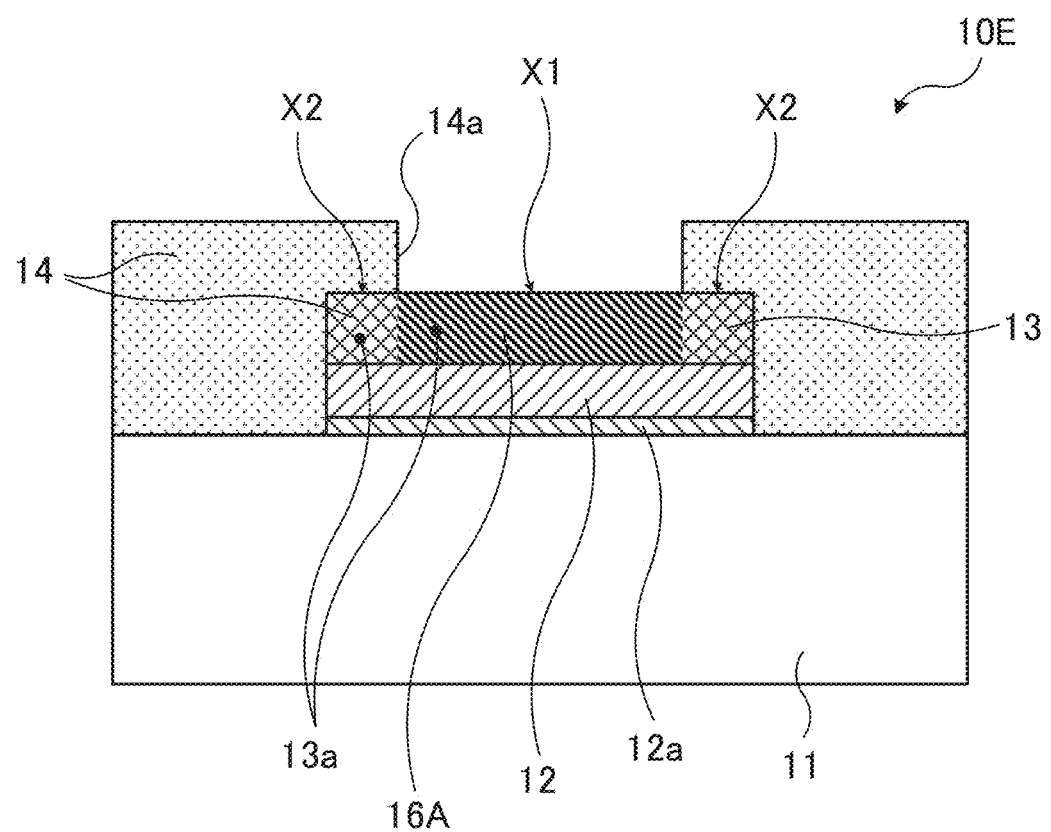
FIG. 21 is a view that illustrates an example of an electronic apparatus according to a sixth embodiment.

FIG. 21 is a view that illustrates an example of an electronic apparatus according to a sixth embodiment. In FIG. 21, a cross-section of a main portion of an example of an electronic apparatus according to a sixth embodiment is illustrated schematically.

An electronic apparatus 10E illustrated in FIG. 21 differs from the above-mentioned electronic apparatus 10A according to the second embodiment in that, among the upper surface and side surfaces of the electrode layer 12, the porous conductor layer 13 is provided on the upper surface only.

For example, the electronic apparatus 10E is formed in the following manner.

First, after the formation of the electrode layer 12 on the substrate 11 as described in FIGS. 7A to 7C, the porous conductor layer 13 is formed on the upper surface of the electrode layer 12 by performing non-electrolytic plating of Ni—P, Ni—B or the like in accordance with the above-mentioned example of FIGS. 8 to 10, before the photoresist 15 is removed. Thereafter, the photoresist 15 is removed in accordance with the above-mentioned example of FIG. 7D, and after the removal, etching of the seed layer 12a exposed is performed.

Next, the insulation layer 14 is formed in accordance with the above-mentioned example of FIGS. 11A to 12C. The insulating material 14b is formed (coated) on the substrate 11 so as to cover the porous conductor layer 13, which is formed on the electrode layer 12 and the upper surface thereof, and the insulating material 14b infiltrates into the inside of the pores 13a of the porous conductor layer 13 as a result of a capillary action. Further, the insulation layer 14, which includes the opening section 14a, is formed as a result of the insulating material 14b on the surfaces and inside the pores 13a in the central section X1 of the porous conductor layer 13 being removed.

After the formation of the insulation layer 14, the conductor section 16A is formed inside the pores 13a in the central section X1 of the porous conductor layer 13 exposed from the opening section 14a of the insulation layer 14, in accordance with the above-mentioned example of FIGS. 14 to 17B.

For example, an electronic apparatus 10E as illustrated in FIG. 21 is formed using such a method.

It is also possible to obtain that same effects as those mentioned above for the above-mentioned electronic apparatus 10A according to the second embodiment using the electronic apparatus 10E according to the sixth embodiment.

Next, a seventh embodiment is described.

Figure 22:
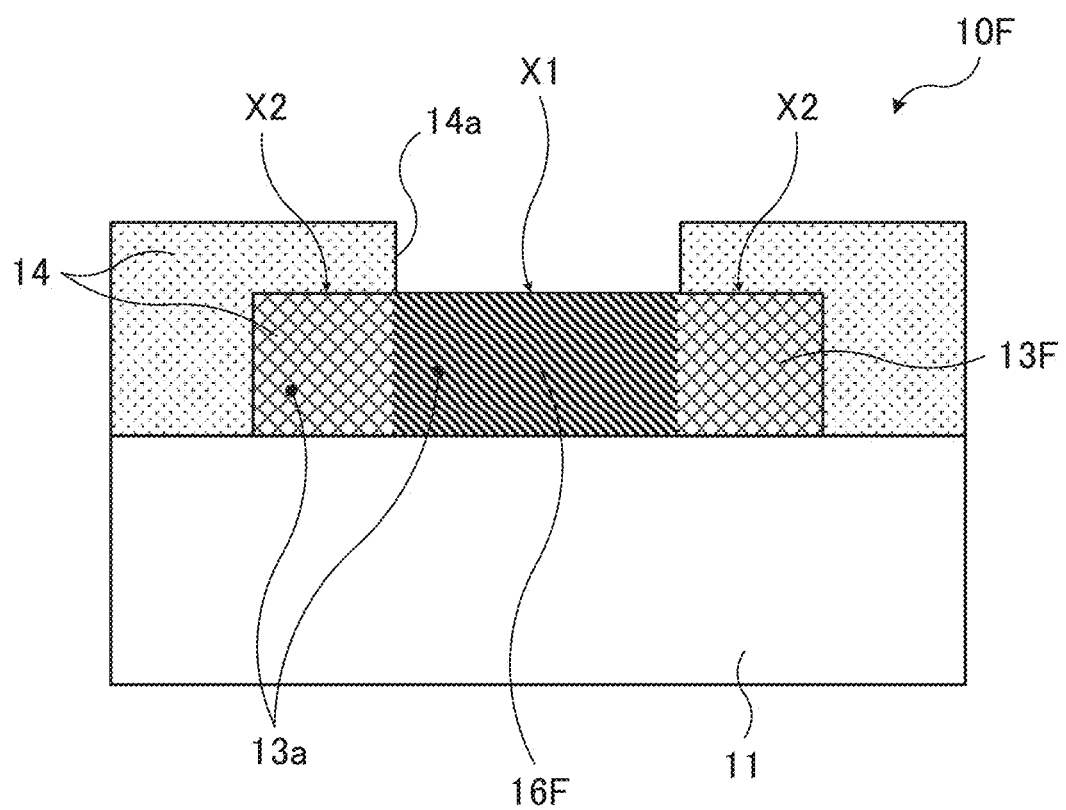
FIG. 22 is a view that illustrates an example of an electronic apparatus according to a seventh embodiment.

FIG. 22 is a view that illustrates an example of an electronic apparatus according to a seventh embodiment. In FIG. 22, a cross-section of a main portion of an example of an electronic apparatus according to a seventh embodiment is illustrated schematically.

An electronic apparatus 10F illustrated in FIG. 22 includes the substrate 11, a porous conductor layer 13F, which is provided on the substrate 11, and the insulation layer 14, which includes the opening section 14a that extends to the central section X1 of the porous conductor layer 13F that is provided on the substrate 11. The insulation layer 14 is provided on the surfaces (the upper surface and the side surfaces in this example) of and inside the pores 13a in the end sections X2 on the outer sides of the central section X1 of the porous conductor layer 13F. A conductor section 16F is provided inside the pores 13a in the central section X1 of the porous conductor layer 13F. In the electronic apparatus 10F, the porous conductor layer 13F and the conductor section 16F, which is provided inside the pores 13a of the porous conductor layer 13F, function as electrode layers.

For example, the following materials may be used in the porous conductor layer 13F and the conductor section 16F of such an electronic apparatus 10F.

For example, a conductor material (Cu or the like) as used in the electrode layer 12 mentioned in the above-mentioned first to sixth embodiments may be used in the porous conductor layer 13F, and a conductor material (Ni or the like) with a diffusion coefficient with respect to solder that is less than that of the conductor material of the porous conductor layer 13F may be used in the conductor section 16F.

Alternatively, a conductor material (Cu or the like) as used in the above-mentioned electrode layer 12 may be used in the conductor section 16F, and a conductor material (Ni or the like) with a diffusion coefficient with respect to solder that is less than that of the conductor section 16F may be used in the porous conductor layer 13F.

Alternatively, or in addition to this, conductor materials (Ni or the like) with diffusion coefficients with respect to solder that are the same or of similar extents may be used in the porous conductor layer 13F and the conductor section 16F.

It is possible to use such combinations of conductor materials in the porous conductor layer 13F and the conductor section 16F.

The porous conductor layer 13F may be formed using a method in which the formation of the porous conductor layer 13, which is mentioned in the above-mentioned first and second embodiments, or the porous conductor layer 13B, which is mentioned in the above-mentioned third embodiment, is adopted.

The conductor section 16F may be formed using a method in which the formation of the conductor section 16A, which is mentioned in the above-mentioned second embodiment, or the conductor section 16B, which is mentioned in the above-mentioned third embodiment, is adopted.

In the formation of the electronic apparatus 10F, first, the porous conductor layer 13F is formed on the substrate 11 using a predetermined method. After the formation of the porous conductor layer 13F, the insulation layer 14 is formed in accordance with the above-mentioned example of FIGS. 11A to 12C. During the formation of the insulation layer 14, the insulating material 14b, which is formed (coated) on the substrate 11, infiltrates into the inside of the pores 13a of the porous conductor layer 13F as a result of a capillary action. Further, the insulation layer 14, which includes the opening section 14a, is formed as a result of the insulating material 14b on the surfaces and inside the pores 13a in the central section X1 of the porous conductor layer 13F being removed. After the formation of the insulation layer 14, the conductor section 16F is formed inside the pores 13a in the central section X1 of the porous conductor layer 13F exposed from the opening section 14a of the insulation layer 14, in accordance with the above-mentioned example of FIGS. 14 to 17. For example, an electronic apparatus 10F as illustrated in FIG. 22 is formed using such a method.

In the electronic apparatus 10F according to the seventh embodiment, the separation of the insulation layer 14 is effectively suppressed as a result of the anchoring effect due to a portion of the foundation of the insulation layer 14 being infiltrated into the inside of the pores 13a of the porous conductor layer 13F. As a result, an electronic apparatus 10F in which the adhesion of the insulation layer 14 is excellent, is realized.

Furthermore, in the electronic apparatus 10F, when a conductor material that exhibits barrier properties is used on either one of the porous conductor layer 13F and the conductor section 16F inside the pores 13a of the porous conductor layer 13F, it is possible to form a solder bonding section with a fixed bonding strength while suppressing excessive alloying of the solder that is used in bonding with other electronic apparatuses. In addition, it is even possible to provide a conductor material that exhibits barrier properties inside a comparatively microscopic opening section 14a such as a diameter of 20 µm or less.

As described above, the electronic apparatuses 10, 10A, 10B, 10C, 10D, 10E, 10F and the like according to the first to seventh embodiments described above may be bonded to other electronic apparatuses using solder. Hereinafter, an example of an electronic apparatus that is used in such solder bonding, and an example of a solder bonded electronic apparatus are respectively described as eighth and ninth embodiments.

First, an eighth embodiment is described.

Figure 23:
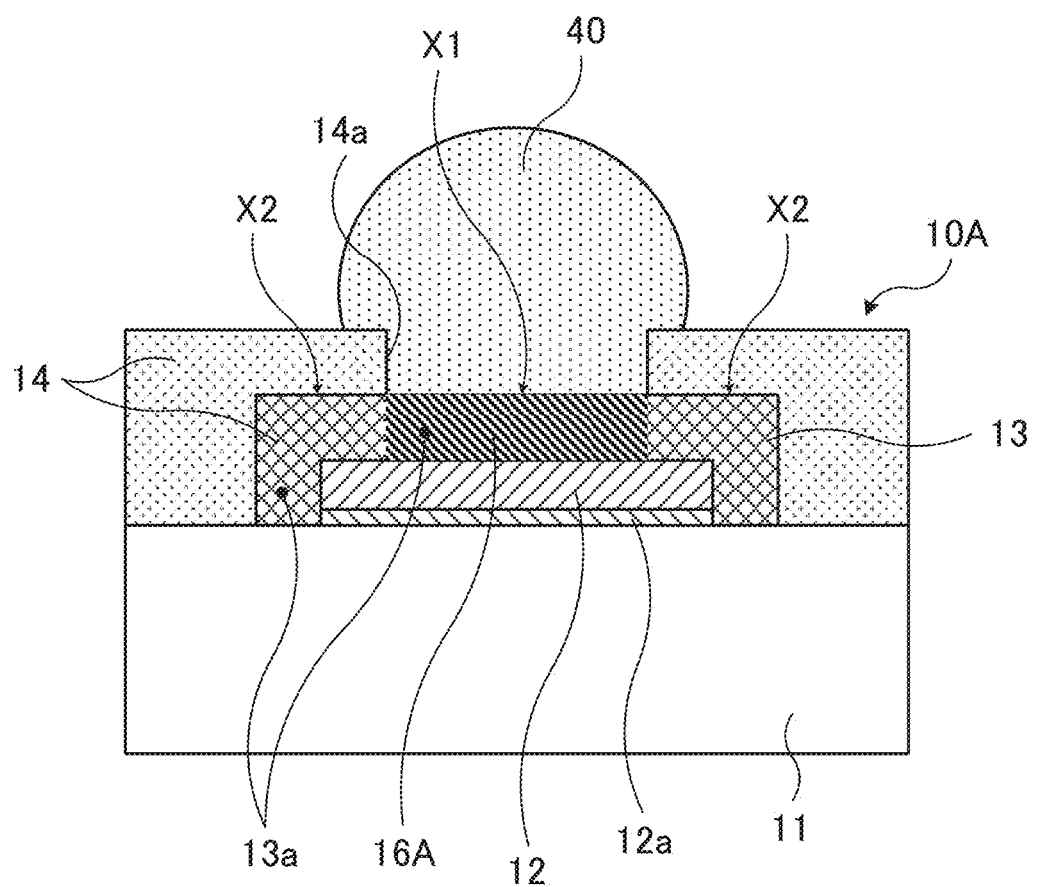
FIG. 23 is a view that illustrates an example of an electronic apparatus according to an eighth embodiment.

FIG. 23 is a view that illustrates an example of an electronic apparatus according to an eighth embodiment. In FIG. 23, a cross-section of a main portion of an example of an electronic apparatus according to an eighth embodiment is illustrated schematically.

Herein, description is given using the electronic apparatus 10A (FIG. 14) mentioned in the above second embodiment, as an example. As illustrated in FIG. 23, solder 40 that is used in bonding with other electronic apparatuses is provided in the central section X1 of the porous conductor layer 13, which is exposed from the opening section 14a of the insulation layer 14 of the electronic apparatus 10A.

For example, tin (Sn) or a substance in which Sn is the main constituent, may be used in the solder 40. For example, components of Ag, Cu, indium (In), bismuth (Bi), or the like may be incorporated in solder in which Sn is the main constituent. It is preferable to use a lead-free solder that does not contain lead (Pb) in the solder 40.

The solder 40 is formed by providing a solder paste, a solder ball, or the like in the central section X1 of the porous conductor layer 13 exposed from the opening section 14a of the insulation layer 14, and carrying out a heating treatment (reflow) thereon at a predetermined temperature.

In the electronic apparatus 10A, during the heating treatment, the separation of the insulation layer 14 is effectively suppressed as a result of the anchoring effect due to a portion of the foundation of the insulation layer 14 being infiltrated into the inside of the pores 13a of the porous conductor layer 13. In addition, during the heating treatment, the solder 40 forms an alloy with the conductor section 16A that is provided inside the pores 13a in the central section X1 of the porous conductor layer 13. As a result, the solder 40 is bonded onto the porous conductor layer 13 with a fixed bonding strength. During the heating treatment, the porous conductor layer 13 exhibits a barrier function, and the diffusion of components of the solder 40 and the electrode layer 12, is suppressed. The presence of the conductor section 16A also contributes to the suppression of such interdiffusion. As a result of reaction (alloying) between the solder 40 and the electrode layer 12 being suppressed, degradation of the electrode layer 12, degradation of a ground conductor section of the electrode layer 12, and the like is suppressed.

Herein, the electronic apparatus 10A that was mentioned in the above-mentioned second embodiment was used as an example. In addition to this, for the electronic apparatuses 10, 10B, 10C, 10D, 10E, 10F and the like according to the first and third to seventh embodiments described above, the solder 40 may be provided similarly at a site exposed from the opening section 14a of the insulation layer 14.

Next, a ninth embodiment is described.

Figure 24:
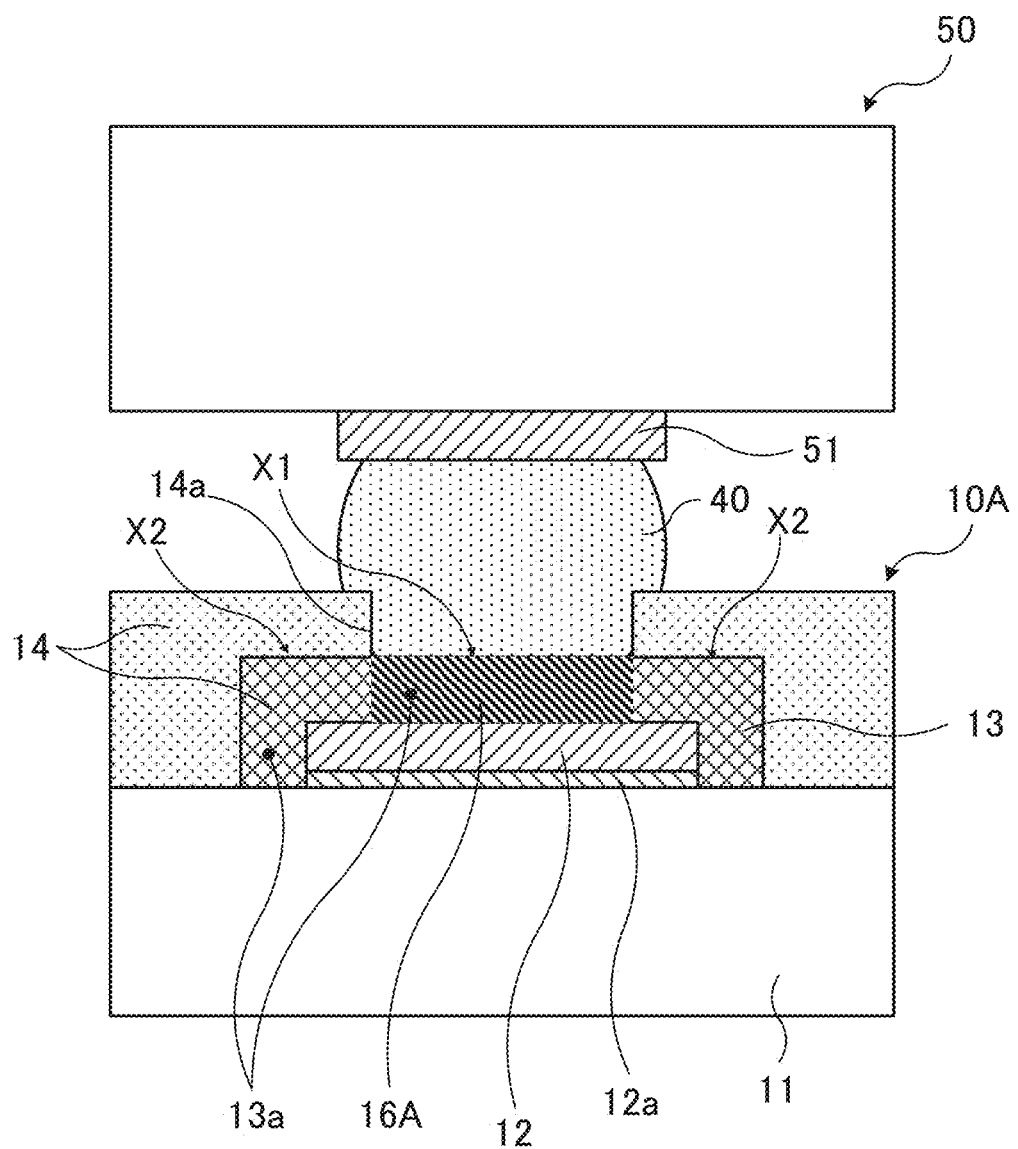
FIG. 24 is a view that illustrates an example of an electronic apparatus according to a ninth embodiment.

FIG. 24 is a view that illustrates an example of an electronic apparatus according to a ninth embodiment. In FIG. 24, a cross-section of a main portion of an example of an electronic apparatus according to a ninth embodiment is illustrated schematically.

Herein, description is given using the electronic apparatus 10A (FIG. 14) mentioned in the above second embodiment, as an example. As illustrated in FIG. 24, the electronic apparatus 10A is bonded to an electronic apparatus 50, which is disposed facing the electronic apparatus 10A, using the solder 40. The solder 40 is bonded to the porous conductor layer 13 and the conductor section 16A of the electronic apparatus 10A, which are exposed from the opening section 14a of the insulation layer 14, and is bonded to a terminal 51, which is provided on the electronic apparatus 50. As a result, the electronic apparatus 10A and the electronic apparatus 50 are electrically connected through the solder 40.

The formation of a bonded body (an electronic apparatus) of the electronic apparatus 10A and the electronic apparatus 50 as illustrated in FIG. 24 may be performed in the following manner. That is, an electronic apparatus 10A, on which the solder 40 is provided in advance as illustrated in FIG. 23 above, and an electronic apparatus 50, on which the terminal 51 is provided, are made to face one another, the solder 40, which is provided on the electronic apparatus 10A side, and the terminal 51 of the electronic apparatus 50 side are bonded together, and a heating treatment is carried out at a predetermined temperature. Alternatively, an electronic apparatus 10A as illustrated in FIG. 14 above, and an electronic apparatus 50, on which the solder 40 is provided on the terminal 51 in advance, are made to face one another, the porous conductor layer 13 (the conductor section 16A) on the electronic apparatus 10A side, and the solder 40 on the electronic apparatus 50 side are bonded together, and a heating treatment is carried out at a predetermined temperature. With such a method, it is possible to form a bonded body of the electronic apparatus 10A and the electronic apparatus 50 as illustrated in FIG. 24.

In the electronic apparatus 10A, at the time of the heating treatment during bonding formation, the separation of the insulation layer 14 is effectively suppressed as a result of the anchoring effect due to a portion of the foundation of the insulation layer 14 being infiltrated into the inside of the pores 13a of the porous conductor layer 13. In addition, during the heating treatment, the solder 40 is bonded onto the porous conductor layer 13 with a fixed bonding strength as a result of alloy formation with the conductor section 16A. The porous conductor layer 13 has a barrier function, and suppresses reaction between the solder 40 and the electrode layer 12, and degradation of the electrode layer 12, degradation of a ground conductor section of the electrode layer 12, and the like resulting therefrom.

Herein, a case in which the electronic apparatus 10A that was mentioned above in the above-mentioned second embodiment, and an electronic apparatus 50 that has a configuration as described above are bonded using the solder 40, was illustrated as an example. In addition to this, it is possible to bond together the electronic apparatuses 10, 10B, 10C, 10D, 10E, 10F and the like according to the above-mentioned first and third to seventh embodiments and the electronic apparatus 50 in the same manner using the solder 40.

In addition, among the electronic apparatuses 10, 10A, 10B, 10C, 10D, 10E, 10F and the like according to the above-mentioned first to seventh embodiments, it is also possible to bond two of the same or two different electronic apparatuses using the solder 40.

It is possible to use a semiconductor device such as a semiconductor chip, a semiconductor package, or a pseudo System on a Chip (Soc), or a circuit board in the electronic apparatuses 10, 10A, 10B, 10C, 10D, 10E, 10F and the like that are described above. Configuration examples of semiconductor devices and circuit boards are described with reference to FIGS. 25A to 28B below.

Figure 25A:
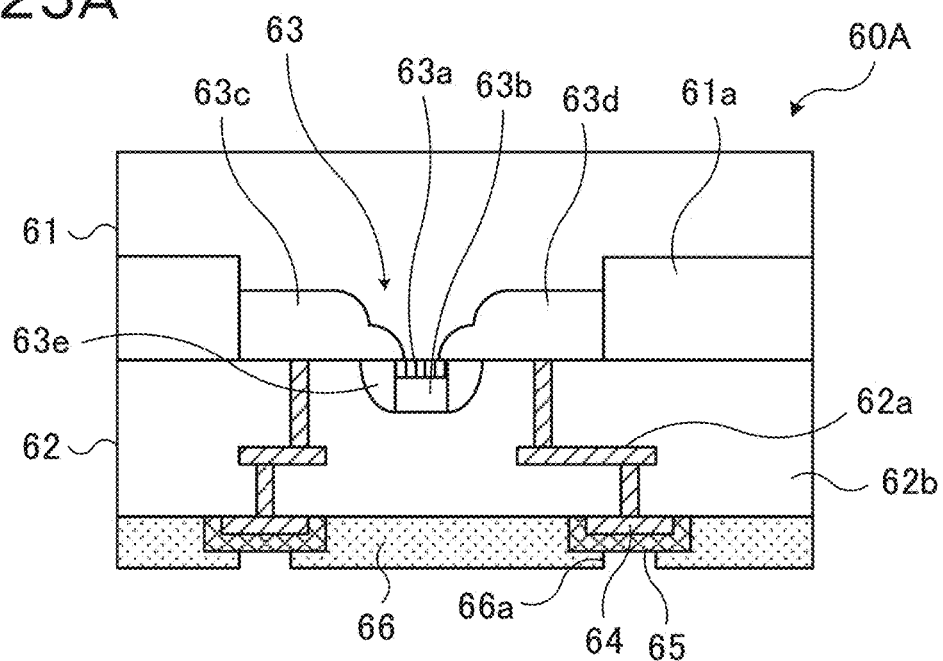
FIGS. 25A and 25B are views that illustrate configuration examples of a semiconductor chip.
Figure 25B:
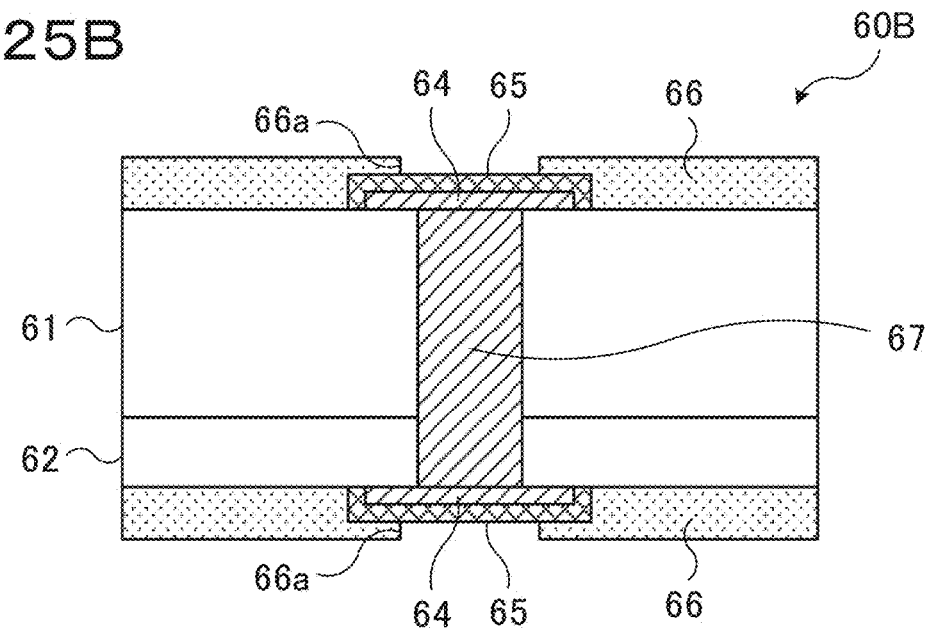

FIGS. 25A and 25B are views that illustrate configuration examples of a semiconductor chip. In FIGS. 25A and 25B, cross-sections of main portions of examples of a semiconductor chip are respectively illustrated schematically.

A semiconductor chip 60A illustrated in FIG. 25A includes a semiconductor substrate 61, on which an element such as a transistor is provided, and a wiring layer 62, which is provided on the semiconductor substrate 61.

In addition to a substrate made from Si, germanium (Ge), silicon germanium (SiGe) or the like, substrates made from gallium arsenic (GaAs), indium phosphide (InP) and the like may be used in the semiconductor substrate 61. Elements such as a transistor, a capacitance, and a resistance may be provided on such a semiconductor substrate 61. As one example of an element, a Metal Oxide Semiconductor (MOS) transistor 63 is illustrated in FIG. 25A.

The MOS transistor 63 is provided in an element region, which is demarcated by an element separation region 61a that is provided on the semiconductor substrate 61. The MOS transistor 63 includes a gate electrode 63b, which is formed on the semiconductor substrate 61 via a gate insulating film 63a, and a source region 63c and a drain region 63d, which are formed inside the semiconductor substrate 61 on both sides of the gate electrode 63b. Insulation film spacers 63e (side walls) are provided on the side walls of the gate electrode 63b.

The wiring layer 62 is provided on a semiconductor substrate 61 on which such as MOS transistor 63 or the like is provided. The wiring layer 62 includes a conductor section 62a (wiring and a via hole), which is electrically connected to the MOS transistor 63 or the like that is provided on the semiconductor substrate 61, and an insulation section 62b, which covers the conductor section 62a. As one example, a conductor section 62a, which is electrically connected to the source region 63c and the drain region 63d of the MOS transistor 63, is illustrated in FIG. 25A. Various conductor materials such as Cu may be used in the conductor section 62a. An inorganic insulating material such as silicon oxide, or an organic insulating material such as a resin may be used in the insulation section 62b.

In the semiconductor chip 60A, for example, an electrode layer 64, a porous conductor layer 65 (may include a conductor section within the pores), and an insulation layer 66 that includes an opening section 66a that extends to the porous conductor layer 65, which have configurations such as those mentioned in the above-mentioned first to sixth embodiments, are provided on the wiring layer 62. The electrode layer 64 is electrically connected to the conductor section 62a of the wiring layer 62. Alternatively, although illustration thereof is omitted from the drawings here, a porous conductor layer, which has a configuration as mentioned in the above-mentioned seventh embodiment, may be provided on the wiring layer 62 of the semiconductor chip 60A electrically connected to the conductor section 62a of the wiring layer 62.

In addition, a semiconductor chip 60B illustrated in FIG. 25B includes a semiconductor substrate 61, a wiring layer 62, which is provided on the semiconductor substrate 61, and a via hole 67 that penetrates through the semiconductor substrate 61. The via hole 67 may also be referred to as a Through Silicon Via (TSV). Herein, as one example, a case in which the via hole 67 also penetrates through the wiring layer 62 is illustrated.

In the semiconductor chip 60B, an electrode layer 64, a porous conductor layer 65 (may include a conductor section within the pores), and an insulation layer 66 that includes an opening section 66a, which have configurations such as those mentioned in the above-mentioned first to sixth embodiments, are provided in positions of the wiring layer 62 and the semiconductor substrate 61 that correspond to the via hole 67. Alternatively, although illustration thereof is omitted from the drawings here, a porous conductor layer, which has a configuration as mentioned in the above-mentioned seventh embodiment, may be provided.

Figure 26A:
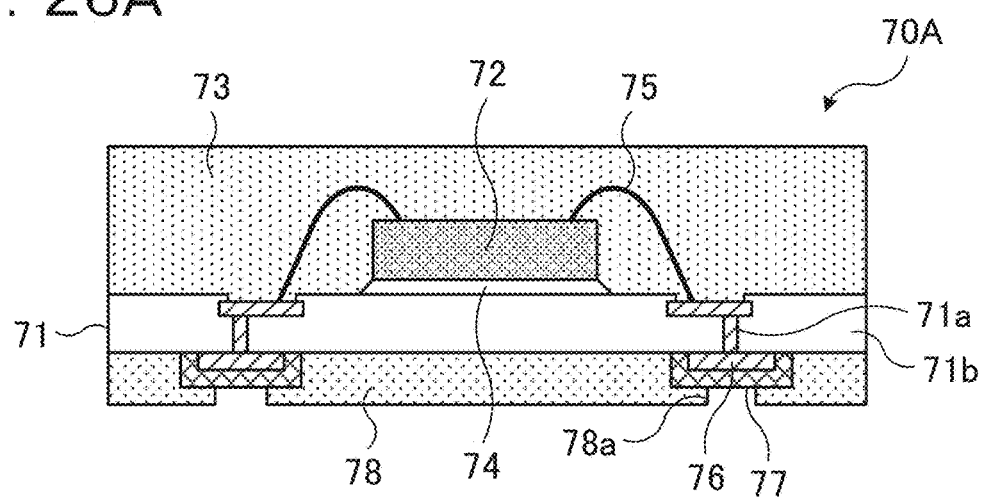
FIGS. 26A and 26B are views that illustrate configuration examples of a semiconductor package.
Figure 26B:
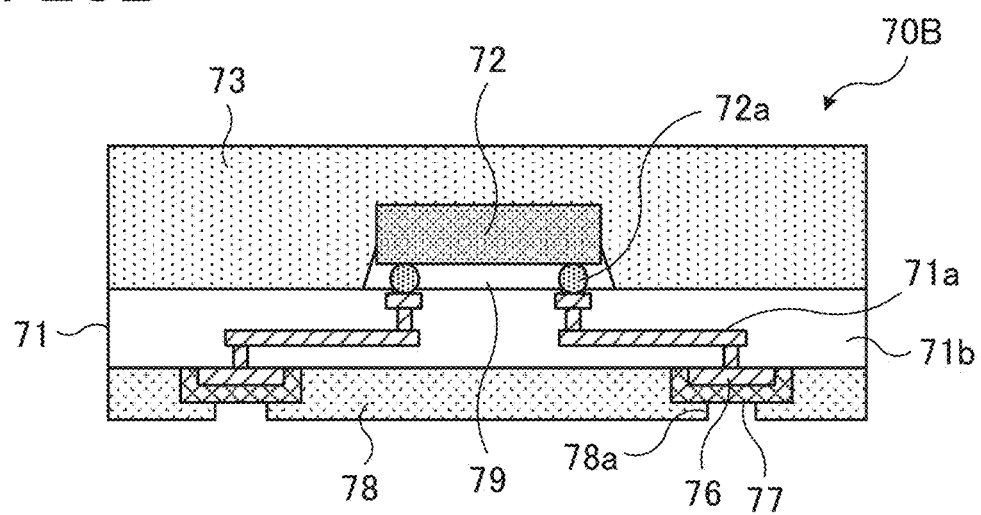

FIGS. 26A and 26B are views that illustrate configuration examples of a semiconductor package. In FIGS. 26A and 26B, cross-sections of main portions of examples of a semiconductor package are respectively illustrated schematically.

A semiconductor package 70A illustrated in FIG. 26A includes a package substrate 71, a semiconductor chip 72, which is installed on the package substrate 71, and a sealing layer 73, which seals the semiconductor chip 72.

For example, a printed circuit board may be used in the package substrate 71. The package substrate 71 includes a conductor section 71a (wiring and a via hole), and an insulation section 71b that covers the conductor section 71a. Various conductor materials such as Cu may be used in the conductor section 71a. A resin material such as a phenolic resin, an epoxy resin, or a polyimide resin, or a composite resin material in which such a resin material is impregnated with glass fiber or carbon fiber may be used in the insulation section 71b.

The semiconductor chip 72 is adhered and fixed onto such a package substrate 71 using a die attach material 74 such as a resin or a conductive paste, and is electrically connected (wire bonded) to the package substrate 71 using wire 75. The semiconductor chip 72 and the wire 75 on the package substrate 71 are sealed with the sealing layer 73. A resin material such as an epoxy resin, or a material in which an insulating filler is incorporated into such a resin material, may be used in the sealing layer 73.

In the semiconductor chip 70A, for example, an electrode layer 76, a porous conductor layer 77 (may include a conductor section within the pores), and an insulation layer 78 that includes an opening section 78a, which have configurations such as those mentioned in the above-mentioned first to sixth embodiments, are provided on the package substrate 71. The electrode layer 76 is electrically connected to the conductor section 71a of the package substrate 71. Alternatively, although illustration thereof is omitted from the drawings here, a porous conductor layer, which has a configuration as mentioned in the above-mentioned seventh embodiment, may be provided on the package substrate 71 of the semiconductor package 70A electrically connected to the conductor section 71a of the package substrate 71.

In addition, a semiconductor package 70B illustrated in FIG. 26B includes a package substrate 71, a semiconductor chip 72, which is installed on the package substrate 71, and a sealing layer 73, which covers the semiconductor chip 72.

The semiconductor chip 72 is electrically connected to (flip-chip bonded) to the package substrate 71 using solder 72a (a bump), which is provided thereon. A space between the package substrate 71 and the semiconductor chip 72 is filled with an underfill material 79. The semiconductor chip 72 on the package substrate 71 is sealed with the sealing layer 73. A resin material such as an epoxy resin, or a material in which an insulating filler is incorporated into such a resin material, may be used in the sealing layer 73.

In the semiconductor package 70B, an electrode layer 76, a porous conductor layer 77 (may include a conductor section within the pores), and an insulation layer 78 that includes an opening section 78a, which have configurations such as those mentioned in the above-mentioned first to sixth embodiments, are provided on the package substrate 71. The electrode layer 76 is electrically connected to the conductor section 71a of the package substrate 71. Alternatively, although illustration thereof is omitted from the drawings here, a porous conductor layer, which has a configuration as mentioned in the above-mentioned seventh embodiment, may be provided on the package substrate 71 of the semiconductor package 70B electrically connected to the conductor section 71a of the package substrate 71.

Additionally, a plurality of the same or differing semiconductor chips 72 may be installed on the package substrate 71 of the semiconductor package 70A and the semiconductor package 70B, or in addition to the semiconductor chip 72, another electronic component such as a chip capacitor may be installed thereon.

Figure 27A:
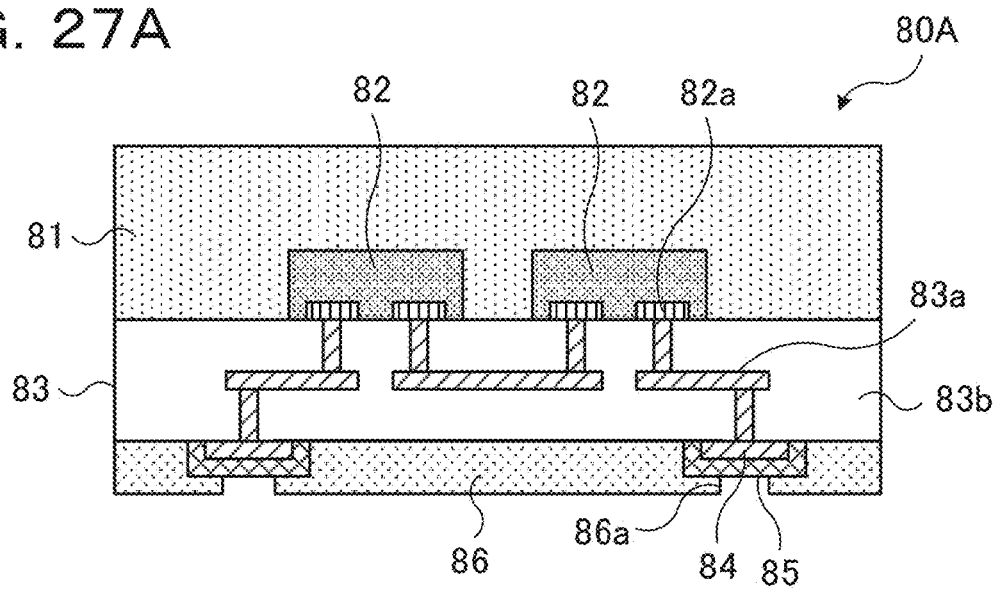
FIGS. 27A and 27B are views that illustrate other configuration examples of a semiconductor package.
Figure 27B:
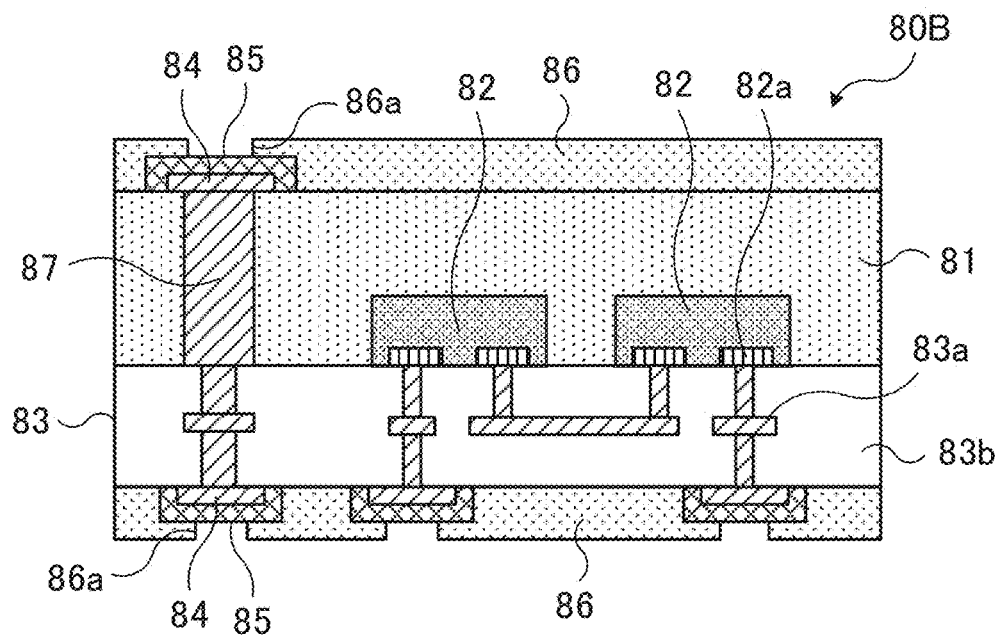

FIGS. 27A and 27B are views that illustrate other configuration examples of a semiconductor package. In FIGS.

27A and 27B, cross-sections of main portions of other examples of a semiconductor package are respectively illustrated schematically.

A semiconductor package 80A illustrated in FIG. 27A includes a resin layer 81, a plurality of (two as an example herein) the same or differing semiconductor chips 82, which are provided embedded in the resin layer 81, and a wiring layer 83 (a rewiring layer) that is provided on the resin layer 81. The semiconductor package 80A may also be referred to as a pseudo SoC.

The semiconductor chips 82 are embedded in the resin layer 81 such that installation surfaces of terminals 82a of the semiconductor chips 82 are exposed. The wiring layer 83 includes a conductor section 83a (rewiring and a via hole) made of Cu or the like, and an insulation section 83b such as a resin material, which covers the conductor section 83a.

In the semiconductor package 80A, for example, an electrode layer 84, a porous conductor layer 85 (may include a conductor section within the pores), and an insulation layer 86 that includes an opening section 86a, which have configurations such as those mentioned in the above-mentioned first to sixth embodiments, are provided on the wiring layer 83. The electrode layer 84 is electrically connected to the conductor section 83a of the wiring layer 83. Alternatively, although illustration thereof is omitted from the drawings here, a porous conductor layer, which has a configuration as mentioned in the above-mentioned seventh embodiment, may be provided on the wiring layer 83 electrically connected to the conductor section 83a of the wiring layer 83.

In addition, a semiconductor package 80B illustrated in FIG. 27B is an example of a form in which, in addition to the configuration mentioned in the semiconductor package 80A, a via hole 87, which penetrates through the resin layer 81, is provided. In the semiconductor package 80B, an electrode layer 84, a porous conductor layer 85 (may include a conductor section within the pores), and an insulation layer 86 that includes an opening section 86a, which have configurations such as those mentioned in the above-mentioned first to sixth embodiments, are provided on the resin layer 81 in positions that correspond to the via hole 87. Alternatively, although illustration thereof is omitted from the drawings here, a porous conductor layer, which has a configuration as mentioned in the above-mentioned seventh embodiment, may be provided.

Additionally, a single semiconductor chip 82, or three or more of the same or differing semiconductor chips 82 may be embedded in the resin layer 81 of the semiconductor package 80A and the semiconductor package 80B, or in addition to the semiconductor chips 82, another electronic component such as a chip capacitor may be embedded therein.

Figure 28A:
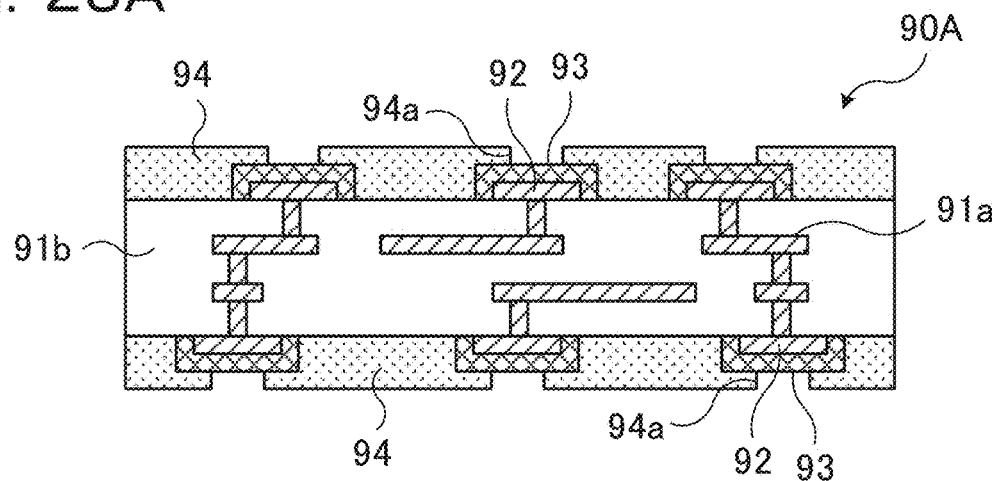
FIGS. 28A and 28B are views that illustrate configuration examples of a circuit board.
Figure 28B:
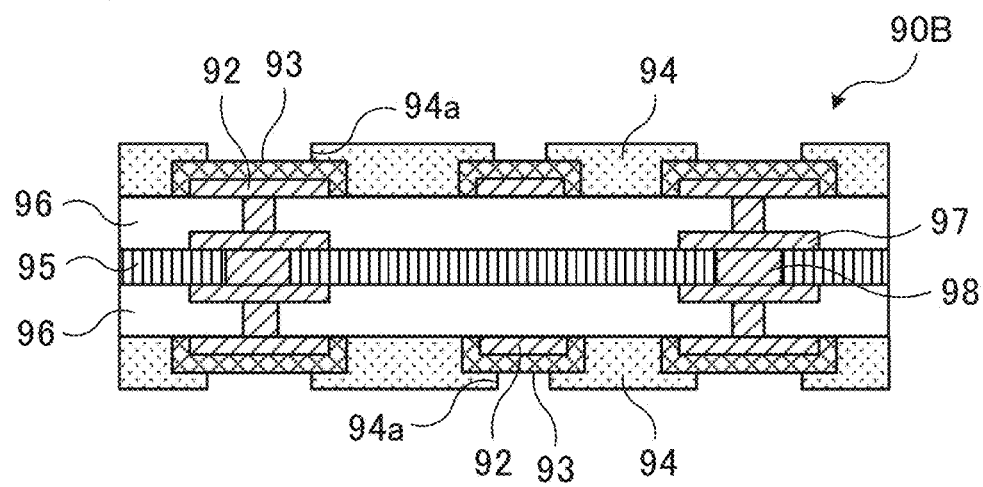

FIGS. 28A and 28B are views that illustrate configuration examples of a circuit board. In FIGS. 28A and 28B, cross-sections of main portions of examples of a circuit board are respectively illustrated schematically.

In FIG. 28A, a multi-layer printed circuit board, which includes a plurality of wiring layers is illustrated, for example, as a circuit board 90A. Similarly to the package substrate 71 illustrated in FIGS. 7A and 7B above, the circuit board 90A includes a conductor section 91a (wiring and a via hole) made of Cu or the like, and an insulation section 91b such as a resin material that covers the conductor section 91a.

For example, an electrode layer 92, a porous conductor layer 93 (may include a conductor section within the pores), and an insulation layer 94 that includes an opening section 94a, which have configurations such as those mentioned in the above-mentioned first to sixth embodiments, are provided on the circuit board 90A. The electrode layer 92 is electrically connected to the conductor section 91a. Alternatively, although illustration thereof is omitted from the drawings here, a porous conductor layer, which has a configuration as mentioned in the above-mentioned seventh embodiment, may be provided on the circuit board 90A electrically connected to the conductor section 91a.

In FIG. 28B, a build-up substrate, which is formed using a build-up construction method, is illustrated, for example, as a circuit board 90B. The circuit board 90B includes a core substrate 95, an insulation layer 96, which is provided on the substrate 95, a conductor pattern 97, which is provided through the insulation layer 96, and a via hole 98 that is connected to the conductor pattern 97. A ceramic material, an organic material or the like, may be used in the substrate 95. An insulating material such as a prepreg may be used in the insulation layer 96. A conductor material such as Cu may be used in the conductor pattern 97 and the via hole 98.

For example, an electrode layer 92, a porous conductor layer 93 (may include a conductor section within the pores), and an insulation layer 94 that includes an opening section 94a, which have configurations such as those mentioned in the above-mentioned first to sixth embodiments, are provided on the circuit board 90B. The electrode layer 92 is electrically connected to the conductor pattern 97 and the via hole 98. Alternatively, although illustration thereof is omitted from the drawings here, a porous conductor layer, which has a configuration as mentioned in the above-mentioned seventh embodiment, may be provided on the circuit board 90B electrically connected to the conductor pattern 97 and the via hole 98.

The semiconductor chips 60A and 60B that are illustrated in FIGS. 25A and 25B, the semiconductor packages 70A, 70B, 80A and 80B that are illustrated in FIGS. 26A to 27B, and the circuit boards 90A and 90B that are illustrated in FIGS. 28A and 28B may be adopted in the electronic apparatuses 10, 10A, 10B, 10C, 10D, 10E, 10F and the like that are mentioned in the above-mentioned first to seventh embodiments.

Hereinafter, examples are discussed.

Example 1

A Ti film with a thickness of 100 nm and Cu film (a seed layer) with a thickness of 200 nm were formed on a substrate that used an Si wafer with a diameter of 150 nm, using a sputtering device. A photoresist was coated thereon to a thickness of 10 μm, and a pattern with a diameter of 100 μm and a pitch of 120 μm was exposed in array form using an exposure device. The exposure amount at this time was 240 mJ/cm$^2$. After an opening pattern (an opening section) of a photoresist was formed as a result of development, a Cu layer with a thickness of 4 μm was formed by performing electrolytic plating using a bright Cu plating solution. After electrolytic plating, the photoresist was removed, and a Cu land (an electrode layer) was formed by performing etching of a Cu film and a Ti film, which were exposed after removal of the photoresist, through immersion in a Cu etching liquid and a Ti etching liquid.

After the formation of the Cu land, a porous Ni-7% P layer (a porous conductor layer) with an average pore diameter of 0.2 μm was formed to a thickness of 3 μm on the surfaces of the Cu land by immersing the substrate in a non-electrolytic Ni—P plating solution, which contained PTFE particles with an average particle size of 0.2 μm, at a bath temperature of 85° C. The average pore diameter of the final surfaces was 4 μm.

A PBO-based resin material (an insulating material) was coated to a thickness of 5 μm on the substrate on which the porous Ni-7% P layer was formed, and a resin layer (an insulation layer) having opening sections, was obtained as a result of exposure using an exposure device and subsequent development of opening sections with a diameter of 20 μm and pitch of 120 μm to match the Cu land. The exposure amount at this time was 300 mJ/cm$^2$.

FIGS. 13A and 13B, which were illustrated earlier are cross-sectional SIM images after the formation of the resin layer, and a structure in which a portion of the resin layer (the insulation layer 14) is formed inside the porous Ni-7% P layer (the porous conductor layer 13), was obtained as a result of the resin material infiltrating up to a bottommost section of the pores of the porous Ni-7% P layer as a result of a capillary action. FIG. 13C, which was illustrated earlier is a cross-sectional SIM image after reflow at 250° C. was performed on this structure three times, and the occurrence of separation of the resin layer from the porous Ni-7% P layer is not observed. As a result of an anchoring effect being realized between the resin layer and the porous Ni-7% P layer, even in a case of a combination of a comparatively brittle resin and Ni, it was confirmed that high adhesion was obtained.

After the formation of the resin layer, which has the opening section, a barrier layer in which the porous Ni-7% P layer and the Cu (the conductor section) were integrated, was formed by causing Cu to infiltrate into the inside of the pores of the porous Ni-7% P layer of the opening section to an extent equivalent to a thickness of 3 μm by further immersing the substrate in a non-electrolytic Cu plating solution. The non-electrolytic Cu plating solution infiltrated into the inside of the pores of the porous Ni-7% P layer, which has a large surface area, as a result of a capillary action, a core desired in the non-electrolytic plating was formed, and it was possible to form Cu inside the pores of the porous Ni-7% P layer that were exposed from the comparatively microscopic opening section with a diameter of 20 μm.

Example 2

A Ti film with a thickness of 100 nm and Cu film (a seed layer) with a thickness of 200 nm were formed on a substrate that used an Si wafer with a diameter of 150 nm, using a sputtering device. A photoresist was coated thereon to a thickness of 10 μm, and a pattern with a diameter of 100 μm and a pitch of 120 μm was exposed in array form using an exposure device. The exposure amount at this time was 240 mJ/cm$^2$. After an opening pattern (an opening section) of a photoresist was formed as a result of development, a Cu layer with a thickness of 4 μm was formed by performing electrolytic plating using a bright Cu plating solution. After electrolytic plating, the photoresist was removed, and a Cu land (an electrode layer) was formed by performing etching of a Cu film and a Ti film, which were exposed after removal of the photoresist, through immersion in a Cu etching liquid and a Ti etching liquid.

After the formation of the Cu land, a porous Ni-7% P layer (a porous conductor layer) with an average pore diameter of 0.2 μm was formed to a thickness of 3 μm on the surfaces of the Cu land by immersing the substrate in a non-electrolytic Ni—P plating solution, which contained PTFE particles with an average particle size of 0.2 μm, at a bath temperature of 85° C. The average pore diameter of the final surfaces was 2 μm.

A PI-based resin material (an insulating material) was coated to a thickness of 5 μm on the substrate on which the porous Ni-7% P layer was formed, and a resin layer (an insulation layer) having opening sections, was obtained as a result of exposure using an exposure device and subsequent development of opening sections with a diameter of 20 μm and pitch of 120 μm to match the Cu land. The exposure amount at this time was 300 mJ/cm$^2$.

A structure in which a portion of the resin layer is formed inside the porous Ni-7% P layer, was obtained as a result of the resin material infiltrating up to a bottommost section of the pores of the porous Ni-7% P layer as a result of a capillary action. Even after reflow at 250° C. was performed on this structure three times, the occurrence of separation of the resin layer from the porous Ni-7% P layer was not observed. As a result of an anchoring effect being realized between the resin layer and the porous Ni-7% P layer, it was confirmed that high adhesion was obtained.

After the formation of the resin layer, which has the opening section, Cu was caused to infiltrate into the inside of the porous Ni-7% P layer of the opening section to an extent equivalent to a thickness of 2.9 μm by further immersing the substrate in a non-electrolytic Cu plating solution, and Au was caused to infiltrate into the remaining sites in which Cu was not formed to an extent equivalent to a thickness of 0.1 μm by further immersing the substrate in a non-electrolytic Au plating solution. As a result, a barrier layer in which the porous Ni-7% P layer, the Cu (a first conductor section), and the Au (a second conductor section) were integrated, was formed. It was possible to form Cu and Au inside the pores of the porous Ni-7% P layer that were exposed from the comparatively microscopic opening section with a diameter of 20 μm.

Example 3

A Ti film with a thickness of 100 nm and Cu film (a seed layer) with a thickness of 200 nm were formed on a substrate that used an Si wafer with a diameter of 150 nm, using a sputtering device. A photoresist was coated thereon to a thickness of 10 μm, and a pattern with a diameter of 30 μm and a pitch of 40 μm was exposed in array form using an exposure device. The exposure amount at this time was 240 mJ/cm$^2$. After an opening pattern (an opening section) of a photoresist was formed as a result of development, a Cu layer with a thickness of 4 μm was formed by performing electrolytic plating using a bright Cu plating solution. After electrolytic plating, the photoresist was removed, and a Cu land (an electrode layer) was formed by performing etching of a Cu film and a Ti film, which were exposed after removal of the photoresist, through immersion in a Cu etching liquid and a Ti etching liquid.

After the formation of the Cu land, a porous Ni-7% P layer (a porous conductor layer) with an average pore diameter of 0.2 μm was formed to a thickness of 3.5 μm on the surfaces of the Cu land by immersing the substrate in a non-electrolytic Ni—P plating solution, which contained PTFE particles with an average particle size of 0.2 μm, at a bath temperature of 85° C.

A PI-based resin material (an insulating material) was coated to a thickness of 3 μm on the substrate on which the porous Ni-7% P layer was formed, and a resin layer (an insulation layer) having an opening section, was obtained as a result of forming an opening section with a diameter of 20

μm and pitch of 40 μm to match the Cu land through exposure using an exposure device and subsequent development.

After the formation of the resin layer, which has the opening section, a barrier layer in which the porous Ni-7% P layer and Ni-1% B (the conductor section) were integrated, was formed by causing non-electrolytic Ni-1% B to infiltrate into the inside of the pores of the porous Ni-7% P layer of the opening section to an extent equivalent to a thickness of 3.5 μm by further immersing the substrate in a non-electrolytic Ni—B plating solution. It was possible to form Ni-1% B inside the pores of the porous Ni-7% P layer that were exposed from the comparatively microscopic opening section with a diameter of 20 μm.

Example 4

A Ti film with a thickness of 100 nm and Cu film (a seed layer) with a thickness of 500 nm were formed on a substrate that used an Si wafer with a diameter of 150 nm, using a sputtering device. A photoresist was coated thereon to a thickness of 10 μm, and a pattern with a diameter of 25 μm and a pitch of 30 μm was exposed in array form using an exposure device. The exposure amount at this time was 240 mJ/cm$^2$. After an opening pattern (an opening section) of a photoresist was formed as a result of development, a Cu layer with a thickness of 3 μm was formed by performing electrolytic plating using a bright Cu plating solution. After electrolytic plating, the photoresist was removed, and a Cu land (an electrode layer) was formed by performing etching of a Cu film and a Ti film, which were exposed after removal of the photoresist, through immersion in a Cu etching liquid and a Ti etching liquid.

After the formation of the Cu land, a porous Cu layer (a porous conductor layer) with an average pore diameter of 0.5 μm was formed to a thickness of 3 μm on the surfaces of the Cu land by immersing the substrate in a non-electrolytic Cu plating solution, which contained a polyacetylene glycol additive.

A PI-based resin material (an insulating material) was coated to a thickness of 5 μm on the substrate on which the porous Cu layer was formed, and a resin layer (an insulation layer) having an opening section, was obtained as a result of forming an opening section with a diameter of 15 μm and pitch of 30 μm to match the Cu land through exposure using an exposure device and subsequent development.

After the formation of the resin layer, which has the opening section, non-electrolytic Ni-9% P was caused to infiltrate into the inside of the porous Cu layer of the opening section to an extent equivalent to a thickness of 3.4 μm by further immersing the substrate in a non-electrolytic Ni—P plating solution, and Au was caused to infiltrate into the remainder to an extent equivalent to a thickness of 0.1 μm by further immersing the substrate in a non-electrolytic Au plating solution. As a result, a barrier layer in which the porous Cu layer, the Ni-9% P (a first conductor section), and the Au (a second conductor section) were integrated, was formed. It was possible to form Ni-9% P and Au inside the pores of the porous Cu layer that were exposed from the comparatively microscopic opening section with a diameter of 15 μm.

Example 5

A Ti film with a thickness of 100 nm and Cu film (a seed layer) with a thickness of 200 nm were formed on a substrate that used an Si wafer with a diameter of 150 nm, using a sputtering device. A photoresist was coated thereon to a thickness of 10 μm, and a pattern with a diameter of 30 μm and a pitch of 40 μm was exposed in array form using an exposure device. The exposure amount at this time was 240 mJ/cm$^2$. After an opening pattern (an opening section) of a photoresist was formed as a result of development, a Cu layer with a thickness of 4 μm was formed by performing electrolytic plating using a bright Cu plating solution. After electrolytic plating, the photoresist was removed, and a Cu land (an electrode layer) was formed by performing etching of a Cu film and a Ti film, which were exposed after removal of the photoresist, through immersion in a Cu etching liquid and a Ti etching liquid.

After the formation of the Cu land, a porous Ag sintered body (a porous conductor layer) with a thickness of 3 μm and an average pore diameter of 0.1 μm was formed on the surfaces of the Cu land by coating with an Ag paste containing Ag particles with an average particle size of 0.1 μm to match the Cu land, and heating with conditions of 200° C. and 30 minutes.

A PI-based resin material (an insulating material) was coated to a thickness of 4 μm on the substrate on which the porous Ag sintered body was formed, and a resin layer (an insulation layer) having an opening section, was obtained as a result of forming an opening section with a diameter of 20 μm and pitch of 40 μm to match the Cu land through exposure using an exposure device and subsequent development.

After the formation of the resin layer, which has the opening section, a barrier layer in which the porous Ag sintered body and Ni-3% B (the conductor section) were integrated, was formed by causing Ni-3% B to infiltrate into the inside of the pores of the porous Ag sintered body of the opening section to an extent equivalent to a thickness of 3 μm by immersing the substrate in a non-electrolytic Ni—B plating solution. It was possible to form Ni-3% B inside the pores of the porous Ag sintered body that were exposed from the comparatively microscopic opening section with a diameter of 20 μm.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
   a first substrate;
   an electrode over the first substrate;
   a first conductor having a porous structure above the first substrate, the first conductor covering an upper surface and a side surface of the electrode; and
   an insulator above the first substrate, the insulator covering an upper surface and a side surface of the first conductor,
   wherein the insulator has an opening that exposes the first conductor.

2. The electronic apparatus according to claim 1, wherein the insulator includes a resin.

3. The electronic apparatus according to claim 1,
wherein a second conductor is included inside pores of the first conductor inside the opening.

4. The electronic apparatus according to claim 3,
wherein a diffusion coefficient of the second conductor is different from a diffusion coefficient of the first conductor with respect to solder.

5. The electronic apparatus according to claim 1, further comprising:
a conductive layer between the first substrate and the electrode.

6. The electronic apparatus according to claim 1,
wherein the first conductor has a pore distribution in which an average pore diameter of pores in a surface section is greater than an average pore diameter of pores in an inner section.

7. The electronic apparatus according to claim 1, further comprising:
a solder bump formed on a surface of the first conductor inside the opening.

8. The electronic apparatus according to claim 7, further comprising:
a second substrate facing the first substrate and coupled to the first substrate through the solder bump.

9. A method for manufacturing an electronic apparatus, comprising:
forming an electrode above a first substrate;
forming a first conductor having a porous structure above the first substrate, the first conductor covering an upper surface and a side surface of the electrode;
forming an insulator above the first substrate, the insulator covering an upper surface and a side surface of the first conductor; and
forming an opening in the insulator, the opening exposes the first conductor.

10. The method for manufacturing an electronic apparatus according to claim 9,
wherein the forming an opening includes removing the insulator formed inside pores of the first conductor inside the opening.

11. The method for manufacturing an electronic apparatus according to claim 9, further comprising:
forming a second conductor inside pores of the first conductor inside the opening.

12. The method for manufacturing an electronic apparatus according to claim 9,
wherein the forming a first conductor includes
immersing the first substrate in a plating solution that contains a component of the first conductor and resin particles,
forming a plating layer, which contains a component of the first conductor and resin particles, above the first substrate using non-electrolytic plating, and
removing the resin particles inside the plating layer.

13. The method for manufacturing an electronic apparatus according to claim 9, further comprising:
forming a second conductor over the first conductor after forming the first conductor, the second conductor having a porous structure where an average pore diameter of pores is greater than an average pore diameter of pores of the first conductor.

14. The method for manufacturing an electronic apparatus according to claim 9, further comprising:
forming a solder bump over the first conductor inside the opening.

15. The method for manufacturing an electronic apparatus according to claim 14, further comprising:
causing the second substrate to face the first substrate and coupling the second substrate to the first substrate through the solder bump.

* * * * *